US012780649B2

(12) United States Patent
Pandiyan et al.

(10) Patent No.: US 12,780,649 B2
(45) Date of Patent: Nov. 3, 2026

(54) FORMING A BONDED INTERFACE USING PLASMA-ACTIVATED SURFACES

(71) Applicant: Quantum Valley Ideas Laboratories, Waterloo (CA)

(72) Inventors: Rajesh Pandiyan, Kitchener (CA); Somayeh M.A.Mirzaee, Kitchener (CA); Sanyasi Bobbara, Waterloo (CA); Su-Peng Yu, Waterloo (CA); Sohail Abdul Jalil, Kitchener (CA); Hadi Amarloo, Waterloo (CA); Sean Michael O'Neill, Elora (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 19/349,435

(22) Filed: Oct. 3, 2025

(65) Prior Publication Data

US 2026/0097953 A1 Apr. 9, 2026

Related U.S. Application Data

(60) Provisional application No. 63/704,734, filed on Oct. 8, 2024.

(51) Int. Cl.

| | |
|---|---|
| ***B81B 7/00*** | (2006.01) |
| ***B81C 3/00*** | (2006.01) |
| ***G04F 5/14*** | (2006.01) |

(52) U.S. Cl.

CPC ............ *B81B 7/0041* (2013.01); *B81C 3/001* (2013.01); *G04F 5/14* (2013.01);

(Continued)

(58) Field of Classification Search

CPC ... G04F 5/145; G04F 5/14; H03L 7/26; B81C 2203/038; B81C 2203/031; B81C 3/001;

(Continued)

(56) References Cited

U.S. PATENT DOCUMENTS

| | | |
|---|---|---|
| 6,331,208 B1 | 12/2001 | Nishida et al. |
| 7,471,866 B2 | 12/2008 | Dumais et al. |

(Continued)

FOREIGN PATENT DOCUMENTS

| | | |
|---|---|---|
| EP | 2546707 | 1/2013 |
| JP | 2006248895 | 9/2006 |

(Continued)

OTHER PUBLICATIONS

CIPO, Notice of Allowance mailed Jun. 3, 2022, in CA 3,157,498, 1 pg.

(Continued)

*Primary Examiner* — Ryan Johnson
(74) *Attorney, Agent, or Firm* — Henry Patent Law Firm PLLC

(57) ABSTRACT

In a general aspect, a bonded interface in a vapor cell is formed using plasma-activated surfaces. In some aspects, manufacturing a vapor cell includes obtaining a dielectric body and an optical window. The dielectric body has a surface that defines an opening to a cavity in the dielectric body, and the cavity is configured to contain a vapor. The surface of the dielectric body and a surface of the optical window are contacted to form a seal around the opening to the cavity. The seal includes a metal oxynitride layer that is disposed along an interface between the surfaces of the dielectric body and the optical window. In certain cases, the seal is formed at a temperature no greater than 150° C.

29 Claims, 23 Drawing Sheets

(52) U.S. Cl.
CPC ................. *B81B 2201/0292* (2013.01); *B81B 2203/0338* (2013.01); *B81C 2201/0169* (2013.01); *B81C 2201/017* (2013.01); *B81C 2203/036* (2013.01)

(58) Field of Classification Search
CPC ....... C03C 27/06; C03C 27/04; C03C 27/042; C03C 27/046; H01L 21/2007; H01L 21/76251
See application file for complete search history.

(56) References Cited

U.S. PATENT DOCUMENTS

| | | | |
|---|---|---|---|
| 7,645,681 | B2 | 1/2010 | Okada |
| 7,859,350 | B1 | 12/2010 | Schwindt et al. |
| 8,588,557 | B2 | 11/2013 | Schmidt et al. |
| 8,796,927 | B2 | 8/2014 | Meinhold |
| 8,906,470 | B2 | 12/2014 | Overstolz et al. |
| 8,970,309 | B2 | 3/2015 | Sato et al. |
| 9,503,021 | B2 | 11/2016 | Hayashi et al. |
| 10,024,929 | B2 | 7/2018 | Parsa et al. |
| 10,370,760 | B2 | 8/2019 | Jacobs et al. |
| 10,509,065 | B1 | 12/2019 | Shaffer |
| 10,509,369 | B1 | 12/2019 | Lemke et al. |
| 10,605,840 | B1 | 3/2020 | Amarloo et al. |
| 10,859,981 | B1 | 12/2020 | Ramirez-serrano et al. |
| 11,054,453 | B2 | 7/2021 | Amarloo et al. |
| 11,112,298 | B2 | 9/2021 | Amarloo et al. |
| 11,137,432 | B1 | 10/2021 | Amarloo et al. |
| 11,137,487 | B1 | 10/2021 | Amarloo et al. |
| 11,150,285 | B2 | 10/2021 | Amarloo et al. |
| 11,209,473 | B2 | 12/2021 | Amarloo et al. |
| 11,300,599 | B1 | 4/2022 | Amarloo et al. |
| 11,303,086 | B1 | 4/2022 | Amarloo et al. |
| 11,303,087 | B1 | 4/2022 | Amarloo et al. |
| 11,307,233 | B1 | 4/2022 | Amarloo et al. |
| 11,313,926 | B1 | 4/2022 | Amarloo et al. |
| 11,366,430 | B2 | 6/2022 | Ramirez-serrano et al. |
| 11,391,797 | B1 | 7/2022 | Amarloo et al. |
| 11,469,566 | B1 | 10/2022 | Amarloo et al. |
| 11,533,101 | B1 | 12/2022 | Pecen et al. |
| 11,855,842 | B1 | 12/2023 | Fishman et al. |
| 11,899,051 | B1 | 2/2024 | Pandiyan et al. |
| 11,977,107 | B1 | 5/2024 | Yu et al. |
| 12,007,425 | B1 | 6/2024 | Yu et al. |
| 12,117,474 | B1 | 10/2024 | Yu et al. |
| 2003/0079823 | A1 | 5/2003 | Sabia |
| 2005/0007118 | A1 | 1/2005 | Kitching et al. |
| 2007/0111471 | A1 | 5/2007 | Okada |
| 2008/0159679 | A1 | 7/2008 | Sigalas et al. |
| 2008/0219615 | A1 | 9/2008 | Cunningham |
| 2008/0252890 | A1 | 10/2008 | Noda et al. |
| 2009/0256638 | A1 | 10/2009 | Rosenbluh et al. |
| 2011/0027930 | A1 | 2/2011 | El-Gamal et al. |
| 2011/0129986 | A1 | 6/2011 | Libralesso et al. |
| 2012/0243088 | A1 | 9/2012 | Nagasaka |
| 2013/0270434 | A1 | 10/2013 | Nelson et al. |
| 2014/0060648 | A1 | 3/2014 | Prasad et al. |
| 2014/0160474 | A1 | 6/2014 | Keller et al. |
| 2015/0027908 | A1 | 1/2015 | Parsa et al. |
| 2015/0028866 | A1 | 1/2015 | Parsa et al. |
| 2015/0192532 | A1 | 7/2015 | Clevenson et al. |
| 2015/0349791 | A1 | 12/2015 | Nakajima |
| 2016/0012930 | A1 | 1/2016 | Parsa et al. |
| 2016/0169989 | A1 | 6/2016 | Suzuki et al. |
| 2016/0218726 | A1 | 7/2016 | Overstolz et al. |
| 2016/0363617 | A1 | 12/2016 | Anderson et al. |
| 2017/0331485 | A1 | 11/2017 | Gobet et al. |
| 2018/0212612 | A1 | 7/2018 | Park et al. |
| 2019/0186007 | A1 | 6/2019 | Jacobs et al. |
| 2019/0187198 | A1 | 6/2019 | Anderson et al. |
| 2020/0044658 | A1 | 2/2020 | Maki et al. |
| 2020/0057116 | A1 | 2/2020 | Zorzos et al. |
| 2020/0333406 | A1 | 10/2020 | Gabrys et al. |
| 2021/0114926 | A1 | 4/2021 | Ramirez-serrano et al. |
| 2021/0132549 | A1 | 5/2021 | Ramirez-serrano et al. |
| 2021/0156735 | A1 | 5/2021 | Amarloo et al. |
| 2021/0156898 | A1 | 5/2021 | Amarloo et al. |
| 2021/0255226 | A1 | 8/2021 | Amarloo et al. |
| 2022/0289565 | A1 | 9/2022 | Dastider et al. |
| 2023/0143437 | A1 | 5/2023 | Lutwak et al. |
| 2025/0098395 | A1 | 3/2025 | Kim |
| 2026/0098877 | A1 | 4/2026 | Pandiyan et al. |
| 2026/0099125 | A1 | 4/2026 | Pandiyan et al. |

FOREIGN PATENT DOCUMENTS

| | | |
|---|---|---|
| JP | 2006278807 | 10/2006 |
| JP | 2015231053 | 12/2015 |
| JP | 2016081997 | 5/2016 |
| JP | 2017079316 | 4/2017 |
| JP | 2019100889 | 6/2019 |
| RU | 2819863 | 5/2024 |
| WO | 2011048979 | 4/2011 |
| WO | 2021077204 | 4/2021 |
| WO | 2021102554 | 6/2021 |
| WO | 2021102555 | 6/2021 |
| WO | 2022255804 | 12/2022 |
| WO | 2026076524 | 4/2026 |

OTHER PUBLICATIONS

USPTO, Notice of Allowance mailed May 4, 2020, in U.S. Appl. No. 16/659,289, 10 pgs.
EPO, Extended European Search Report mailed Nov. 14, 2022, in EP 20879738.1, 11 pgs.
USPTO, Non-Final Office Action mailed May 18, 2020, in U.S. Appl. No. 16/659,289, 12 pgs.
USPTO, Final Office Action mailed Jun. 22, 2020, in U.S. Appl. No. 16/659,276, 13 pgs.
USPTO, Notice of Allowance mailed Jul. 30, 2020, in U.S. Appl. No. 16/659,289, 13 pgs.
USPTO, Notice of Allowance mailed Nov. 8, 2019, in U.S. Appl. No. 16/410,479, 14 pgs.
USPTO; Non-Final Office Action mailed Feb. 1, 2021, in U.S. Appl. No. 16/996,652, 14 pgs.
USPTO, Notice of Allowance mailed Apr. 27, 2021, in U.S. Appl. No. 16/996,663, 17 pgs.
USPTO, Notice of Allowance mailed Nov. 20, 2020, in U.S. Appl. No. 16/996,652, 18 pgs.
JPO, Office Action issued in Japanese Application No. 2022-519168 on Jun. 1, 2023, 2 pages.
USPTO, Final Office Action mailed Dec. 8, 2021, in U.S. Appl. No. 17/103,358, 20 pgs.
USPTO, Non-Final Office Action mailed Apr. 30, 2020, in U.S. Appl. No. 16/659,276, 20 pgs.
USPTO, Notice of Allowance mailed May 17, 2021, in U.S. Appl. No. 16/996,652, 20 pgs.
USPTO, Notice of Allowance mailed Jul. 26, 2021, in U.S. Appl. No. 17/308,588, 24 pgs.
USPTO, Non-Final Office Action mailed Jan. 2, 2020, in U.S. Appl. No. 16/659,289, 26 pgs.
USPTO, Final Office Action mailed Feb. 10, 2020, in U.S. Appl. No. 16/659,289, 29 pgs.
USPTO, Advisory Action mailed Sep. 24, 2020, in U.S. Appl. No. 16/659,276, 3 pgs.
USPTO, Non-Final Office Action mailed Dec. 28, 2020, in U.S. Appl. No. 16/996,663, 31 pgs.
USPTO, Non-Final Office Action mailed Jun. 24, 2019, in U.S. Appl. No. 16/410,479, 34 pgs.
USPTO, Non-Final Office Action mailed Sep. 10, 2021, in U.S. Appl. No. 17/103,358, 34 pgs.
CIPO, Office Action issued in Application No. 3,154,731 on Feb. 2, 2024, 4 pages.
CIPO, Office Action mailed Apr. 4, 2023, in CA 3,154,731, 4 pgs.
https://cdn.rohde-schwarz.com/dk/seminars_workshops/BaseStationInstallationandAntennaTesting_2017_V1_Shared_DK.pdf retrieved Nov. 7, 2018, 40 pgs.

(56) References Cited

OTHER PUBLICATIONS

JPO, Office Action issued in Application No. 2022-519168 on Oct. 30, 2023, 6 pages.
USPTO, Restriction Requirement mailed Jan. 10, 2020, in U.S. Appl. No. 16/659,276, 6 pgs.
USPTO, Restriction Requirement mailed Nov. 27, 2020, in U.S. Appl. No. 16/996,663, 6 pgs.
USPTO, Notice of Allowance mailed Mar. 17, 2022, in U.S. Appl. No. 17/103,358, 8 pgs.
WIPO, International Search Report and Written Opinion mailed Dec. 10, 2020, in PCT/CA2020/051271, 8 pgs.
USPTO, Notice of Allowance mailed Oct. 2, 2019, in U.S. Appl. No. 16/410,479, 9 pgs.
WIPO, International Search Report and Written Opinion mailed Dec. 22, 2020, in PCT/CA2020/051269, 9 pgs.
WIPO, International Search Report and Written Opinion mailed Oct. 9, 2020, in PCT/CA2020/051009, 9 pgs.
Wikipedia, "Hydroxide," retrieved from https://en.wikipedia.org/wiki/Hydroxide on Feb. 5, 2020, 2020, 7 pgs.
U.S. Appl. No. 16/659,276.
"Analyzing RFoCPRI(TM) at Fiber-Based Cell Sites", https://www.viavisolutions.com/en-us/literature/analyzing-rfocpri-fiber-based-cell-sites-application-notes-en.pdf retrieved Nov. 7, 2018, 2 pgs.
"Drone Cell Tower Inspection, Survey, Thermal Imaging and LIDAR", https://abjdrones.com/drone-cell-tower-inspection-services retrieved Nov. 7, 2018, 6 pgs.
"inUAVI: Developing advanced electronic sensors and payloads for UAV's and Aerospace", http://inuavi.io retrieved Nov. 7, 2018, 5 pgs.
Amarloo, et al., "A Vapor Cell for Electromagnetic Imaging Using Rydberg Atom-based Electrometry", Aug. 9, 2019, 6 pgs.
Anderson, et al., "A self-calibrating SI-traceable broadband Rydberg atom-based radio-frequency electric field probe and measurement instrument", arXiv:1910.07107v2 [physics.atom-ph], Oct. 18, 2019, 12 pgs.
Chutani, "Design, Technology and Packaging of Cesium Vapor Cells for MEMS Atomic Clocks", Dissertation, Engineering Sciences, Université de Franche-comté, 2011, 37 pgs.
Douahi, et al., "Vapour microcell for chip scale atomic frequency standard", Electronics Letters 43, 279, 2007, 2007, 2 pages.
Fan, et al., "Atom based RF electric field sensing", Journal of Physics B: Atomic, Molecular and Optical Physics 48 202001 (2015), Sep. 9, 2015, 17 pgs.
Fan, et al., "Dispersive radio frequency electrometry using Rydberg atoms in a prism-shaped atomic vapor cell", J. Phys. B: At. Mol. Opt. Phys. 49 (2016) 104004, 2016, 8 pgs.
Fan, et al., "Effect of Vapor-Cell Geometry on Rydberg-Atom-Based Measurements of Radio-Frequency Electric Fields", Physical Review Applied 4, 044015 (2015), 2015, 7 pgs.
Fan, et al., "Subwavelength microwave electric-field imaging using Rydberg atoms inside atomic vapor cells", Optics Letters, vol. 39, No. 10, 3030-3033, May 15, 2014, 4 pgs.
Goodman, "Introduction to Fourier Optics", McGraw-Hill Companies, Inc., 1968, 457 pgs.
Gosele, et al., "Wafer bonding for microsystems technologies", Sensors and Actuators 74, 161-168, 1999, 8 pgs.
Holloway, et al., "Atom-Based RF Electric Field Measurements: An Initial Investigation of the Measurement Uncertainties", IEEE International Symposium on Electromagnetic Compatibility, 2015, 6 pgs.
Karlen, "Fabrication and Characterization of MEMS alkali vapor cells used in chip-scale atomic clocks and other atomic devices", Dissertation, Univ. of Neuchâtel, 2018, 156 pgs.
Knapkiewicz, "Technological Assessment of MEMS Alkali Vapor Cells for Atomic References", micromachines, 10,25, Dec. 31, 2018, 20 pgs.
Knappe, et al., "A microfabricated atomic clock", Applied Physics Letters 85, 1460 (2004). https://doi.org/10.1063/1.1787942, 2004, 3 pages.
Kumar, et al., "Atom-Based Sensing of Weak Radio Frequency Electric Fields Using Homodyne Readout", Scientific Reports 7:42981, Feb. 20, 2017, 10 pgs.
Kumar, et al., "Rydberg-atom based radio-frequency electrometry using frequency modulation spectroscopy in room temperature vapor cells", Optics Express, vol. 25, No. 8, Apr. 17, 2017, 13 pgs.
Lehto, et al., "Part V Encapsulation of MEMS Components", Handbook of Silicon Based MEMS Materials and Technologies, Feb. 22, 2010, 118 pgs.
Li, et al., "Low temperature Si/Si wafer direct bonding using a plasma activated method", Journal of Zhejiang University-Sci C (Comput & Electron) 14(4):244-251, 2013, 8 pgs.
Liew, et al., "Microfabricated alkali atom vapor cells", Appl.Phys. Lett. 84, 2694, 4 pgs (2004).
Masteika, et al., "A Review of Hydrophilic Silicon Wafer Bonding", ECS Journal of Solid State Science and Technology, 3 (4) Q42-Q54, 2014, 13 pgs.
Nie, et al., "Pressure Aided Low Temperature Direct Bonding of Silicon Wafers with High Surface Roughness", 2006 1st IEEE Intl Conf on Nano/Micro Engineered and Molecular Systems, Jan. 18, 2006, 5 pgs.
Noaman, et al., "Vapor Cell Characterization and Optimization for Applications in Rydberg Atom-Based Radio Frequency Sensing", Proceedings vol. 12447, Quantum Sensing, Imaging, and Precision Metrology; 124470V (2023), Mar. 8, 2023, 6 pages.
Noda, "Photonic Crystals", Comprehensive Microsystems, 2008, 12 pgs.
Qin, et al., "Low-Temperature Bonding for Silicon-Based Micro-Optical Systems", Photonics, vol. 2, No. 4, Multidisciplinary Digital Publishing Institute, Dec. 15, 2015, 38 pgs.
Schnars, "Direct phase determination in hologram interferometry with use of digitally recorded holograms", J.Opt. Soc.Am.A, vol. 11, No. 7, Jul. 1994, 5 pgs.
Schwindt, et al., "Chip-scale atomic magnetometer", Applied Physics Letters 85, 6409 (2004). https://doi.org/10.1063/1.1839274, 2004, 3 pages.
Scullion, et al., "Slotted Photonic Crystal Sensors", Sensors 2013, 13, 3675-3710, Mar. 15, 2013, 36 pgs.
Sedlacek, et al., "Atom-Based Vector Microwave Electrometry Using Ribidium Rydberg Atoms in a Vapor Cell", Physical Review Letters, Aug. 6, 2013, 5 pgs.
Sedlacek, et al., "Microwave electrometry with Rydberg atoms in a vapour cell using bright atomic resonances", Nature Physics, vol. 8, 819-824 (2012), Sep. 16, 2012, 6 pgs.
Sedlacek, et al., "Quantum Assisted Electrometry using Bright Atomic Resonances", arXiv:1205.4461v1 [physics.atom-ph], May 20, 2012, 15 pgs.
Shaffer, et al., "A read-out enhancement for microwave electric field sensing with Rydberg atoms", Proc. SPIE vol. 10674, Quantum Technologies 2018, 2018, 12 pgs.
Sievenpiper, et al., "Two-dimensional photonic-crystal vertical-cavity array for nonlinear optical image processing", Applied optics 37.11, Apr. 10, 1998, 5 pgs.
Subramonian, et al., "Micro-drilling of silicon wafer by industrical CO2 laser", International Journal of Mechanical and Materials Engineering, Feb. 26, 2015, 6 pgs.
Suni, "Direct Wafer Bonding for MEMS and microelectronics", Dissertation, Helsinki Univ. of Tech., Aug. 18, 2006, 140 pgs.
Suni, et al., "Effects of Plasma Activation on Hydrophilic Bonding of Si and SiO2", Journal of the Electrochemical Society, 149 (6) G348-G351, 2002, 4 pgs.
Tong, et al., "Low Temperature Wafer Direct Bonding", Journal of Microelectromechanical Systems, vol. 3, No. 1, Mar. 1994, 7 pgs.
Vignolini, et al., "Near-field imaging of coupled photonic-crystal microcavities", Applied Physics letters 94.15, Apr. 14, 2009, 4 pgs.
Vrijsen, "Collective Quantum Behavior of Atomic Ensembles in High-Finesse Optical Cavities", Dissertation, Stanford University., Dec. 2011, 112 pgs.
Ye, et al., "Molecular lodine Clock", Physical Review Letters 87, 27, 270801, Dec. 31, 2001, 4 pgs.
ISA, International Search Report and Written Opinion issued in Application No. PCT/CA2025/051309 on Jan. 28, 2026, 7 pages.

(56) References Cited

OTHER PUBLICATIONS

USPTO, Non-Final Office Action issued in U.S. Appl. No. 19/352,265 on Jan. 28, 2026, 41 pages.
Straessle, et al., "Microfabricated alkali vapor cell with anti-relaxation wall coating", Applied Physics Letters, 105, 043502, Jul. 28, 2014, 5 pages,.
USPTO, Restriction Requirement issued in U.S. Appl. No. 19/352,249 on Feb. 11, 2026, 6 pages.
ISA, International Search Report and Written Opinion issued in Application No. PCT/CA2025/051326 on Dec. 8, 2025, 7 pages.
USPTO, Non-Final Office Action issued in U.S. Appl. No. 19/352,249 on May 7, 2026, 81 pages.
USPTO, Non-Final Office Action issued in U.S. Appl. No. 19/352,265 on May 14, 2026, 40 pages.

770

Bilayer bonding at 200 °C
in vacuum

1000

| Sample ID | Substrates/interfaces | Surface treatments |
|---|---|---|
| 1 | Glass *(without plasma treatment)* | RAC (SC-I) solution (5:1:1 mixture of $H_2O$:$NH_4OH$:$H_2O_2$) at temperature of 75° C for 15 min, followed by deionized water (DI) rinse and dried with pure Nitrogen gas ($N_2$) |
| 2 | Glass | ***$O_2$ plasma:*** RF power: 400W; Pressure: 350mT; Gas flow rate: 180 sccm; exposure time: 120 sec<br>***$N_2$ plasma:*** RF power: 400W; Pressure: 350mT; Gas flow rate: 90 sccm; exposure time: 120 sec |
| 3 | Silicon | ***$N_2$ plasma:*** RF power: 400W; Pressure: 350mT; Gas flow rate: 90 sccm; exposure time: 120 sec |
| 4 | Silicon | ***$O_2$ plasma:*** RF power: 400W; Pressure: 350mT; Gas flow rate: 180 sccm; exposure time: 120 sec<br>***$N_2$ plasma:*** RF power: 400W; Pressure: 350mT; Gas flow rate: 90 sccm; exposure time: 120 sec |
| 5 | $SiO_2$/Si *(without plasma treatment)* | After thermal oxidation process, piranha cleaned solution (2:1 mixture of $H_2SO_4$: $H_2O_2$) for 10 min, followed by deionized water (DI) rinse and dried with pure Nitrogen gas ($N_2$); |
| 6 | $SiO_2$/Si | ***$O_2$ plasma:*** RF power: 400W; Pressure: 350mT; Gas flow rate: 180 sccm; exposure time: 60 sec<br>***$N_2$ plasma:*** RF power: 400W; Pressure: 350mT; Gas flow rate: 90 sccm; exposure time: 40 sec |
| 7 | a-Si/glass | ***$O_2$ plasma:*** *RF power: 400W; Pressure: 350mT; Gas flow rate: 180 sccm; exposure time: 60 sec*<br>***$N_2$ plasma:*** *RF power: 400W; Pressure: 350mT; Gas flow rate: 90 sccm; exposure time: 40 sec* |

FIG. 10

FORMING A BONDED INTERFACE USING PLASMA-ACTIVATED SURFACES

CROSS-REFERENCE TO RELATED APPLICATIONS

This application claims priority to U.S. Prov. Pat. App. No. 63/704,734, which was filed on Oct. 8, 2024, and entitled, "Forming a Bonded Interface Using Plasma-Activated Surfaces." The disclosure of the priority application is hereby incorporated herein by reference in its entirety.

BACKGROUND

The following description relates to forming a bonded interface using plasma-activated surfaces. The bonded interface may, for example, be part of a vapor cell and may define a hermetic seal.

Vapor cells can be manufactured by sealing a vapor within an enclosed volume. The vapor can be used as a medium to interact with electromagnetic fields that are incident on the vapor cell. Beams of light generated by lasers can be directed through the vapor to probe and measure the response of the vapor to the electromagnetic fields. In this way, a vapor cell can be used to determine properties of the electromagnetic fields.

DESCRIPTION OF DRAWINGS

FIG. 10 is a table showing examples of parameters for processing silicon and silicon oxide surfaces for bonding;

DETAILED DESCRIPTION

Figure 1A:
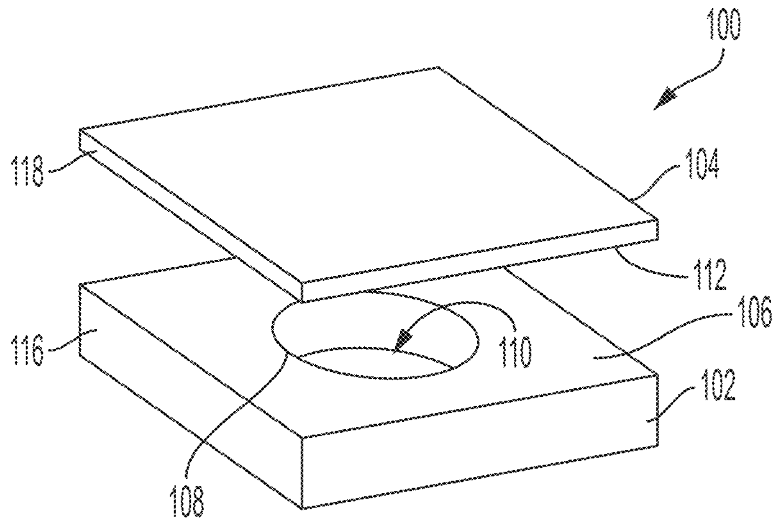
FIG. 1A is an exploded view, in perspective, of an example vapor cell having a dielectric body and an optical window.

In a general aspect, a vapor cell may be manufactured by obtaining a dielectric body and an optical window. The dielectric body has a surface that defines an opening to a cavity in the dielectric body. The optical window also has a surface, and this surface may be contacted to the surface of the dielectric body to form a bonded interface that includes a seal around the opening to the cavity. However, before contacting the surfaces, the surfaces may be exposed to a sequence of plasmas to produce respective altered surfaces. These altered surfaces may then be contacted to form the bonded interface and seal. The cavity is configured to contain a vapor of the vapor cell, and as such, the seal may serve as a hermetic seal that prevents the vapor from exiting the cavity via the opening. In some implementations, the sequence of plasmas includes an oxygen plasma and a nitrogen plasma. In these implementations, the seal includes a metal oxynitride layer between the surfaces of the dielectric body and the optical window. The metal oxynitride layer may, in certain cases, also extend from the seal along part or all of the bonded interface. In some cases, the bonded interface is formed at a temperature below 150° C. In some cases, the oxygen plasma precedes the nitrogen plasma.

In some implementations, the vapor cell is manufactured using manufacturing processes that ensure the hermetic, ultra-high vacuum sealing of the vapor cell at low temperatures. These low temperatures may, for example, be no greater than 200° C. (e.g., 125° C.). The processes may also be used to enclose a vapor in a hermetically sealed body of the vapor cell, such as in an internal cavity of the vapor cell. The vapor may be a vapor having Rydberg electronic states (e.g., a Rydberg vapor), such as a vapor of alkali metal atoms (e.g., vapor of Cs, a vapor of Rb, etc.). In some implementations, the vapor cell is a microelectromechanical (MEMs) vapor cell.

In some implementations, the vapor cell is manufactured to include a vapor of alkali metal atoms. In these implementations, the vapor cell may be coated with an anti-relaxation coating, such as a polymer coating. With this coating, the vapor cell may be configured for use as a Rydberg atom-based sensor, an atomic clock, or for magnetometry. For atomic clocks and magnetometry, the anti-relaxation coating may prevent the depolarization of atomic nuclear spin, thereby increasing integration times. For Rydberg atom-based sensing, the anti-relaxation coating can be used to passivate the internal cavity of the vapor cell to suppress electric fields caused by alkali metal atoms. The anti-relaxation coating may also suppress electric fields caused by other species of atoms and molecules as well as suppressing the bonding of alkali metal atoms to internal surfaces of the vapor cell. Such suppression may increase the coherence times of Rydberg atoms in the vapor cell.

Most known, anti-relaxation coatings, however, include long chain polymers (e.g., waxes) that are kept under 180° C. to preserve their properties. In contrast, low temperature anodic bonding requires temperatures around 250° C. to properly form bonds. Thus, if used to bond the components of a vapor cell, low temperature anodic bonding may degrade an anti-relaxation coating that is present during the anodic bonding process. In addition to degrading anti-relaxation coatings, high temperatures during bonding can also drive unwanted gases into the internal cavity of the vapor cell cavity, and these driven gases may collide with the alkali metal atoms (which may also lead to decoherence). A low temperature bonding process can therefore be advantageous when manufacturing a vapor cell.

In some implementations, a manufacturing process for a vapor cell may incorporate bonding processes to bond the vapor cell at low temperatures using layers based on a glass//Si, Si/$SiO_2$//glass architecture or on a glass//a-Si/glass architecture. Here, "//" refers to a bonding interface; "/" refers to an interface; and "a-Si" refers to amorphous silicon. In these implementations, the bonding processes include a pre-surface modification of the interfacial layers by plasma activation at room temperature. However, in certain cases, the bonding processes may include adhesion layers (e.g., of Si, a-Si, $SiO_2$, etc.) to bond other materials (e.g., sapphire). The surface and interfacial properties may be tailored using the plasmas to support the strong, hermetic sealing of the vapor cell. As such, the vapor cell may be capable of supporting a high or ultrahigh vacuum environment.

In some implementations, the bonding processes include sequential oxygen-nitrogen ($O_2/N_2$) plasma treatments. These treatments are employed to modify the surfaces of the vapor cell components before bonding. For example, an ex-situ oxygen-nitrogen plasma may be used to treat a silicon surface with a native oxide surface or a thermally oxidized surface (e.g. via LPCVD) to form a few nanometers of a non-stoichiometric silicon oxynitride ($SiO_xN_y$) layer. This silicon oxynitride layer may enhance the resulting bond (e.g., in strength, hermeticity, etc.). Amorphous silicon thin films can also be used as an interfacial layer. These films may use the same plasma treatment process since the surface of the film may also possess a native oxide surface. The films may have a thickness ranging from 10 nm to 100 nm as well as a low surface roughness. The amorphous silicon thin film, when treated with an ex-situ oxygen-nitrogen ($O_2/N_2$) plasma treatment, can be used to enhance the bond strength of glass//a-Si/glass wafer assemblies, as the amorphous silicon acts as a very thin (e.g., 10 nm-100 nm) adhesion layer.

X-ray photoelectron (XPS) spectroscopic analysis reveals that plasma treatment in a mixed oxygen-nitrogen ($O_2/N_2$) environment can improve the formation of silicon oxynitride layers. For example, the formation of a reactive silicon oxynitride layer on a silicon substrate may be increased by over a factor of two with a sequential $O_2/N_2$ surface plasma activation when compared to the case of an $N_2$ plasma treatment alone. Moreover, the formation rate of the silicon oxynitride layer may be larger on an oxidized Si surface than a borosilicate glass surface. However, the plasma treatment can be used on glass surfaces. XPS spectroscopic analysis of silicon oxynitride layers is discussed further in relation to FIGS. 11A-15. The bond strength, interface integrity, and fracture toughness of the bonded surfaces (e.g., glass//silicon/$SiO_2$//glass or glass//a-Si/glass//a-Si/glass) were also evaluated using a crack-opening test (e.g., using a razor blade), dicing, and/or cleaving. Such experimental testing is described further below.

In a general aspect, the bonding processes are effective at integrating a layer of silicon oxynitride into a bonding interface for bonding two surfaces of a vapor cell together. The layer of silicon oxynitride may be a few nanometers thick and is generated by exposing at least one of the surfaces to a $O_2/N_2$ plasma. The two surfaces may then be contacted together to form the bonding interface, which in turn, allows the formation of a hermetic seal between the two surfaces. As such, the bonding processes may allow for the hermetic, vacuum sealing of vapor cells at low temperatures (e.g., at 200° C. or lower). Such low temperature bonding allows for the internal coating of vapor cells with long-chain polymers and other coatings. These coatings can be used to passivate and protect the internal surfaces of the vapor cells from reaction with the vapor (e.g., a vapor of alkali metal atoms) and collisional relaxation of the nuclear spin of the vapor's constituents (e.g., the alkali metal atoms).

In some implementations, the bonding processes may be used to manufacture vapors cells that include a vapor of alkali metal atoms. These vapor cells may be used, for example, as Rydberg atom-based radio frequency (RF) sensors. Microfabricated (e.g., MEMs) vapor cells have spurred on a new generation of devices based on atomic vapors, where atomic spectroscopy is used to readout time, frequency, inertial forces, magnetic fields and electric fields. The MEMs vapor cells, due their greater uniformity and controlled construction (especially when compared to glass blown vapor cells) can be used for Rydberg atom sensing. Moreover, large numbers of MEMs vapor cells may be required for products, especially if arrays of vapor cells are necessary for applications.

Figure 1B:
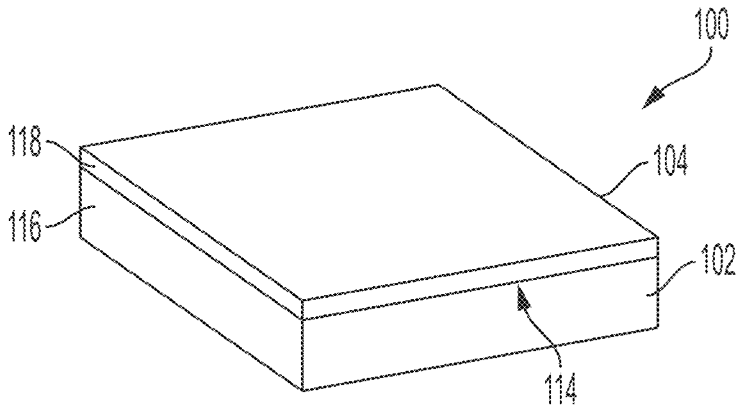
FIG. 1B is a perspective view of the example vapor cell of FIG. 1A, but in which the optical window is bonded to the dielectric body.

Now referring to FIG. 1A, an exploded view is presented, in perspective, of an example vapor cell 100 having a dielectric body 102 and an optical window 104. FIG. 1B presents the example vapor cell 100 of FIG. 1A, but in which the optical window 104 is bonded to the dielectric body 102, such as by using the bonding processes described in relation to FIGS. 3-15. The dielectric body 102 may be a substrate defined by planar surfaces on opposite sides of the dielectric body 102, as shown in FIGS. 1A-1B. However, other configurations are possible for the dielectric body 102. Moreover, although FIGS. 1A-1B depict the dielectric body 102 as being square, other shapes are possible (e.g., circular). The optical window 104 may also be a substrate defined by planar surfaces. However, other configurations are possible for the optical window 104. In general, the optical window 104 includes one surface adapted to mate (or bond) with a surface of the dielectric body 102, thereby allowing a seal to form (e.g., via a hybrid bond that includes a metal oxynitride layer).

The dielectric body 102 may be formed of a material transparent to electric fields (or electromagnetic radiation) that are measured by the example vapor cell 100. The material may be an insulating material having a high resistivity, e.g., $\rho>10^8\ \Omega\cdot$cm, and may also correspond to a single crystal, a polycrystalline ceramic, or an amorphous glass. For example, the dielectric body 102 may be formed of silicon. In another example, the dielectric body 102 may be formed of a glass that includes silicon oxide (e.g., $SiO_2$, $SiO_x$, etc.), such as vitreous silica, a borosilicate glass, or an aluminosilicate glass. In some instances, the material of the dielectric body 102 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$) and may also be a combination of one or more binary oxides (e.g., Y: $ZrO_2$, $LaAlO_3$, etc.). In some implementations, the material of the dielectric body 102 is a non-oxide material such as silicon (Si), diamond (C), gallium nitride (GaN), calcium fluoride (CaF), and so forth.

In some implementations, an interfacial layer is disposed on the dielectric body 102 to define a surface 106 of the dielectric body 102. The interfacial layer may be capable of bonding to the material of the dielectric body 102 (e.g., oxide, non-oxide, etc.) while also being capable of forming a hybrid bond with the optical window 104. This capability may be achieved, in many cases, by modifying an exposed surface of the interfacial layer to include reactive metal oxygen (e.g., M-O) and metal nitrogen (e.g., M-N) bonds, such as by using a sequential plasma activation process. For example, the dielectric body 102 may be formed of silicon and the example vapor cell 100 may include an interfacial layer on the dielectric body 102 that includes silicon oxide (e.g., $SiO_2$, $SiO_x$, etc.). This interfacial layer defines the surface 106 of the dielectric body 102 and can form reactive silicon oxygen bonds (e.g., Si—O) and silicon nitrogen bonds (e.g., Si—N) when fabricated according to the bonding processes described herein. As another example, the dielectric body 102 may be formed of a glass that includes silicon oxide and the example vapor cell 100 may include an interfacial layer on the dielectric body 102 that is made of amorphous silicon (e.g., a-Si). This interfacial layer defines the surface 106 of the dielectric body 102 and can also form reactive silicon oxygen bonds (e.g., Si—O) and silicon nitrogen bonds (e.g., Si—N) when fabricated according to the bonding processes described herein.

The dielectric body 102 includes a surface 106 that defines an opening 108 to a cavity 110 in the dielectric body 102. The surface 106 may be a planar surface, as shown in FIGS. 1A-1B, although other surfaces are possible (e.g., curved). The opening 108 may be any type of opening that allows access to an internal volume of the cavity 110 and may have any shape (e.g., circular, square, hexagonal, oval, etc.). Such access may allow a vapor (or a source of the vapor) to be disposed into the cavity 110 during manufacture of the vapor cell 100. The cavity 110 extends from the surface 106 into the dielectric body 102 and stops before extending completely through the dielectric body 102. The cavity 110 may have a uniform cross-section along its extension through the dielectric body. However, in certain cases, the cross-section of cavity 110 may vary along its extension.

The example vapor cell 100 includes a vapor (not shown) in the cavity 110 of the dielectric body 102. The vapor may include constituents such as a gas of Group IA atoms, a noble gas, a gas of diatomic halogen molecules, or a gas of organic molecules. For example, the vapor may include a gas of alkali metal atoms (e.g., K, Rb, Cs, etc.) and possibly also a noble gas (e.g., He, Ne, Ar, Kr, etc.). If present, the noble gas may serve as a buffer gas in certain cases. In another example, the vapor may include a gas of diatomic halogen molecules (e.g., $F_2$, $Cl_2$, $Br_2$, etc.) and possibly also a noble gas. In yet another example, the vapor may include a gas of organic molecules (e.g., acetylene) and possibly a noble gas. Other combinations for the vapor are possible, including other constituents. In many implementations, the vapor has Rydberg electronic states. For example, the vapor may include a gas of alkali metal atoms having Rydberg electronic states that can interact with an optical signal (e.g., a laser signal), an RF field, or both. Examples of vapors with Rydberg electronic states are described in U.S. Pat. No. 11,112,298 entitled "Vapor Cells for Imaging of Electromagnetic Fields".

Figure 1C:
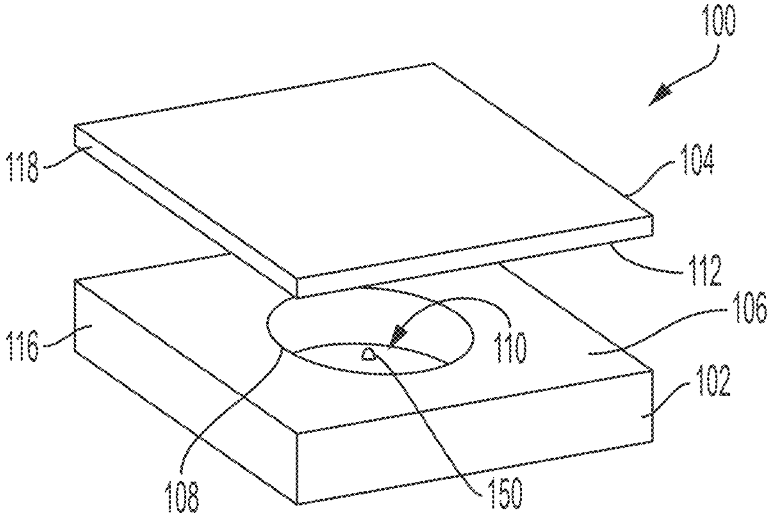
FIG. 1C is an exploded view, in perspective, of the example vapor cell of FIG. 1A, but in which a source of a vapor resides in a cavity of the example vapor cell.

In some implementations, the example vapor cell 100 includes a source of the vapor in the cavity 110 of the dielectric body 102. The source of the vapor may generate the vapor in response to an energetic stimulus, such as heat, exposure to ultraviolet radiation, and so forth. FIG. 1C presents a schematic diagram of the example vapor cell 100 of FIG. 1A but in which a source of a vapor 150 resides in cavity 110. The source of the vapor 150 may be an alkali metal mass that is sufficiently cooled to be in a solid or liquid phase when disposed into the cavity 110. In these implementations, and after forming a seal around the opening 108 to the cavity 110, laser light may be used to irradiate the alkali metal mass through the optical window 104, thereby heating the alkali metal mass and causing its temperature to increase. In response, the alkali metal mass may generate (e.g., via sublimation, boiling, etc.) a vapor of alkali metal atoms, which then fills the cavity 110. However, other forms are possible for the source of the vapor 150. For example, the source of the vapor 150 could be a chemical compound that decomposes to produce a vapor of alkali metal atoms in response to an energetic stimulus, such as heat, irradiation, and so forth.

Figure 1D:
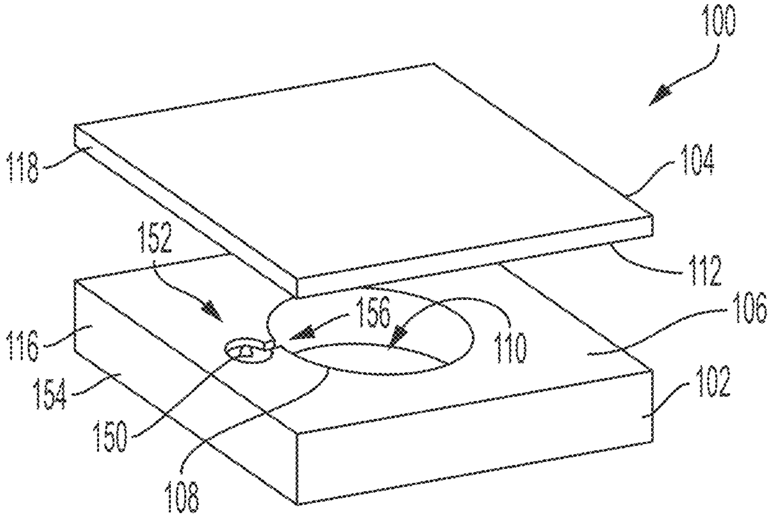
FIG. 1D is an exploded view, in perspective, of the example vapor cell of FIG. 1A, but in which a source of a vapor resides in a second cavity of the example vapor cell.

In some implementations, the source of the vapor 150 may reside in a cavity different than the cavity 110. This configuration may allow the example vapor cell 100 to have a region for producing vapor that is separate from a region for sensing electromagnetic fields. For example, as shown in FIG. 1D, the cavity 110 may be a first cavity and the dielectric body 102 may include a second cavity 152. In these cases, the source of the vapor 150 resides in the second cavity 152, and upon receiving an energetic stimulus (e.g., heat, irradiation, etc.), the source 150 produces a vapor of alkali metal atoms in the second cavity 152. The vapor of alkali metal atoms then proceeds to diffuse from the second cavity 152, through the channel 156, and into the first cavity 110. When filled with the vapor of alkali metal atoms, the first cavity 110 may define the sensing region of the example vapor cell 100.

The presence of the second cavity 152 may be useful in situations where the source of the vapor 150 leaves a residue after producing the vapor of alkali metal atoms. This residue, if left in the first cavity 110, would be undesirable as the first cavity 110 defines the sensing region of the example vapor cell 100. For example, if left in the first cavity 110, the residue could interfere with laser light entering in the first cavity 110 to interact with the vapor of alkali metal atoms. The residue could also interact with the vapor (e.g. via collisions with the alkali metal atoms) to reduce the sensitivity of the example vapor cell 100 to electromagnetic fields. In some implementations, the second cavity 152 is offset from the first cavity 110 in the dielectric body 102. For example, the second cavity 152 may reside between the first cavity 110 and an outer surface 154 of the dielectric body 102. In these cases, the second cavity 152 may define a side pocket of the dielectric body 102. Moreover, the outer surface 154 may correspond to an outer side surface of the dielectric body 102, such as the outer perimeter surface 116 on a side wall of the dielectric body 102.

The example vapor cell 100 additionally includes the optical window 104. As shown in FIG. 1B, the optical window 104 covers the opening 108 of the cavity 110 and has a surface 112 bonded to the surface 106 of the dielectric body 102, thereby forming a bonded interface between the dielectric body 102 and the optical window 104. This bond forms a seal around the opening 108, and as such, the bonded interface includes the seal. Moreover, the bond is a hybrid bond that is formed using the bonding processes described in relation to FIGS. 3-15. As such, the seal includes a metal oxynitride layer disposed along an interface 114 (e.g., the bonded interface) between the surface 106 of the dielectric body 102 and the surface 112 of the optical window 104.

The metal oxynitride layer may, in certain cases, be a material having a composition of $MO_xN_y$ where M represents the metal(s), x represents the stoichiometry of oxygen, and y represents the stoichiometry of nitrogen. Moreover, the metal oxynitride layer may be formed by reacting metal oxygen (e.g., M-O) and metal nitrogen (e.g., M-N) bonds on the surfaces 106, 112 of the dielectric body 102 and the optical window 104 when contacted together. If one or both of the dielectric body 102 (or an interfacial layer thereon) and the optical window 104 include silicon oxide, the metal oxynitride layer may be formed as a silicon oxynitride layer (e.g., a $SiO_xN_y$ material). However, other types of metal oxynitride layers are possible. For example, if the dielectric body 102 and the optical window are both made of sapphire (e.g., $Al_2O_3$), the metal oxynitride layer may be formed as an aluminum oxynitride layer (e.g., a $AlO_xN_y$ material). If the dielectric body 102 is made of a glass that includes silicon oxide and the optical window 104 is made of sapphire, the metal oxynitride layer may be formed as a silico-aluminum oxynitride layer (e.g., a $Si_aAl_bO_xN_y$ material) having two metals (e.g., M=Si and Al).

The optical window 104 may be formed of a material transparent to the electromagnetic radiation (e.g., laser light) used to probe the vapor sealed within the cavity 110 of the dielectric body 102. For example, the material of the optical window 104 may be transparent to infrared wavelengths of electromagnetic radiation (e.g., 700-1000 nm), visible wavelengths of electromagnetic radiation (e.g., 400-7000 nm), or ultraviolet wavelengths of electromagnetic radiation (e.g., 10-400 nm). Moreover, the material of the optical window 104 may be an insulating material having a high resistivity, e.g., $\rho>10^8$ Ω·cm, and may also correspond to a single crystal, a polycrystalline ceramic, or an amorphous glass. For example, the material of the optical window 104 may include silicon oxide (e.g., $SiO_2$, $SiO_x$, etc.), such as found within quartz, vitreous silica, or a borosilicate glass. In another example, the material of the optical window 104 may include aluminum oxide (e.g., $Al_2O_3$, $Al_xO_y$, etc.), such as found in sapphire or an aluminosilicate glass. In some instances, the material of the optical window 104 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., Y: $ZrO_2$, $LaAlO_3$, etc.). In other instances, the material of the dielectric body 102 is a non-oxide material such as diamond (C), calcium fluoride (CaF), and so forth.

In many implementations, the surface 106 of the dielectric body 102 and the surface 112 of the optical window 104 may have a surface roughness Ra, no greater than a threshold surface roughness. The threshold surface roughness may ensure that, during hybrid bonding, pathways are not formed that leak through the seal. Such pathways, if present, might allow contamination to enter the cavity 110 as well as allowing vapor to exit the vapor cell 100. In some variations, the threshold surface roughness is less than 50 nm. In some variations, the threshold surface roughness is less than 30 nm. In some variations, the threshold surface roughness is less than 10 nm. In some variations, the threshold surface roughness is less than 1 nm. In some implementations, the example vapor cell 100 includes an antirelaxation coating (e.g., a coating of paraffin) on one or more surfaces of the cavity 110.

Figure 2A:
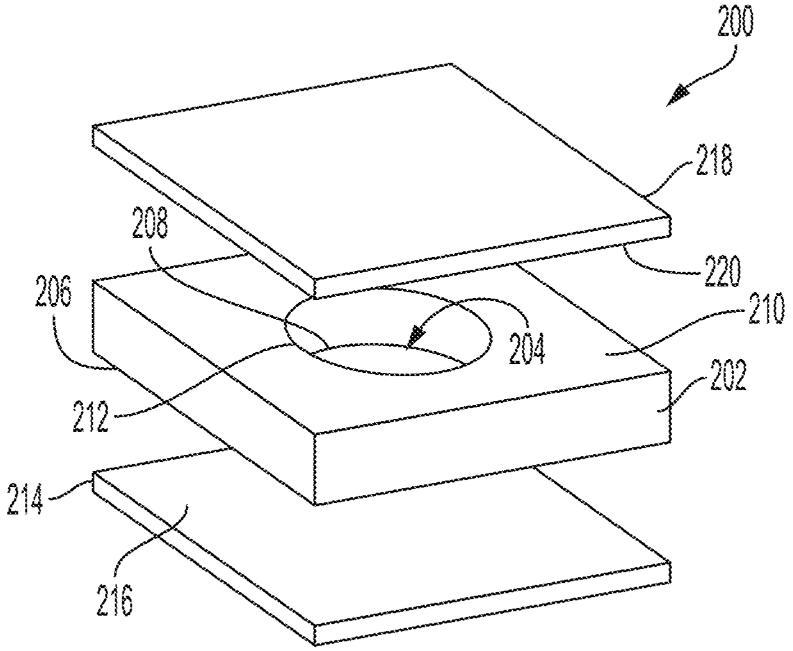
FIG. 2A is an exploded view, in perspective, of an example vapor cell having two optical windows.
Figure 2B:
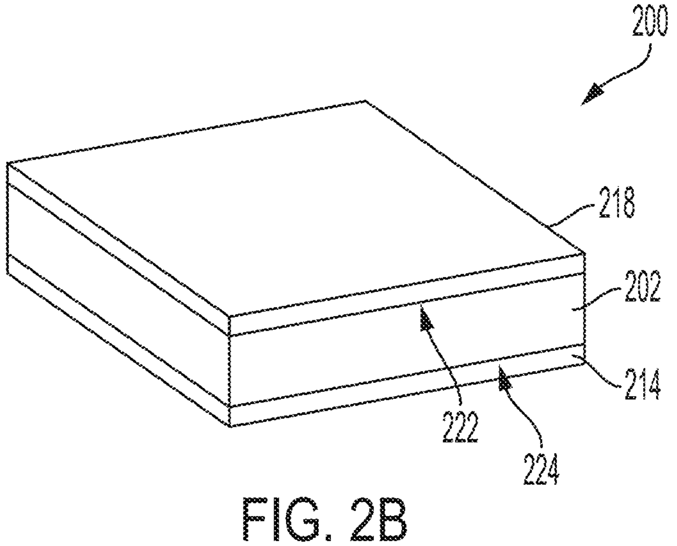
FIG. 2B is a perspective view of the example vapor cell of FIG. 2A, but in which both optical windows are bonded to a dielectric body of the example vapor cell.

Although FIGS. 1A and 1B depict the example vapor cell 100 as having a single optical window, two or more optical windows are possible. Moreover, in certain cases, the cavity 110 may extend entirely through dielectric body 102. FIG. 2A presents an exploded view, in perspective, of an example vapor cell 200 having two optical windows. The example vapor cell 200 may be analogous in many features to the example vapor cell 100 shown by FIGS. 1A-1D. FIG. 2B presents the example vapor cell 200 of FIG. 2A, but in which both optical windows are bonded to a dielectric body 202 of the example vapor cell 200. At least one of the bonds is a hybrid bond, such as described in relation to the example vapor cell 100 of FIGS. 1A-1D. The example vapor cell 200 includes the dielectric body 202 and a cavity 204 in the dielectric body 202. The cavity 204 extends completely through the dielectric body 202. A first surface 206 of the dielectric body 202 defines a first opening 208 to the cavity 204, and a second surface 210 of the dielectric body 202 defines a second opening 212 to the cavity 204.

The example vapor cell 200 also includes a first optical window 214 covering the first opening 208 of the cavity 204. The first optical window 214 has a surface 216 bonded to the first surface 206 of the dielectric body 202 to form a first seal around the first opening 208. The example vapor cell 200 additionally includes a second optical window 218 covering the second opening 212 of the cavity 204. The second optical window 218 has a surface 220 bonded to the second surface 210 of the dielectric body 202 to form a second seal around the second opening 212. A vapor or a source of the vapor (not shown) may, in certain instances, reside in the cavity 204 of the dielectric body 202. However, in some instances, the dielectric body 202 includes a second cavity and the source of the vapor resides in the second cavity.

The dielectric body 202 and the optical windows 214, 218 may share features in common with, respectively, the dielectric body 102 and the optical window 104 described in relation to the example vapor cell 100 of FIGS. 1A-1B. For example, the dielectric body 202 may be formed of silicon (Si), aluminum oxide (e.g., $Al_2O_3$), or a glass that includes silicon oxide (e.g., $SiO_2$, $SiO_x$, etc.). In another example, one or both of first and second optical windows 214, 218 may be formed of a material transparent to electromagnetic radiation (e.g., laser light) used to probe the vapor sealed within the cavity 204 of the dielectric body 202. Other features and their combinations are possible. Similarly, the vapor and the source of the vapor may share features in common with, respectively, the vapor and the source of the vapor described in relation to the example vapor cell 100 of FIGS. 1A-1D. For example, the vapor may include a gas of alkali-metal atoms, a noble gas, a gas of diatomic halogen molecules, a gas of organic molecules, or some combination thereof. In another example, the source of the vapor may reside in the cavity 204 of the dielectric body 202, and the source of the vapor may include a liquid or a solid source of alkali metal atoms configured to generate a gas of the alkali-metal atoms when heated or irradiated. Other features and their combinations are possible.

In some implementations, such as shown in FIGS. 2A-2B, the first and second surfaces 206, 210 of the dielectric body 202 are planar surfaces opposite each other, and the surface 216 of the first optical window 214 and the surface 220 of the second optical window 218 are planar surfaces. In some implementations, the second surface 210 of the dielectric body 202 and the surface 220 of the second optical window 218 have a surface roughness, $R_a$, no greater than a threshold surface roughness. In some variations, the threshold surface roughness is less than 50 nm. In some variations, the threshold surface roughness is less than 30 nm. In some variations, the threshold surface roughness is less than 10 nm. In some variations, the threshold surface roughness is less than 1 nm. In further implementations, the threshold surface roughness is a second threshold surface roughness, and the first surface 206 of the dielectric body 202 and surface 216 of the first optical window 214 have a surface roughness, Ra, no greater than a first threshold surface roughness. The first threshold surface roughness need not be the same as the second threshold surface roughness.

In some implementations, the second seal is formed after the first seal, thereby allowing the second optical window 218 to enclose the cavity 204. In these implementations, the second seal may be formed using a hybrid bonding process, such as described in relation to FIGS. 3-15. As such, the second seal includes a metal oxynitride layer disposed along an interface 222 between the second surface 210 of the dielectric body 202 and the surface 220 of the second optical window 218. In certain cases, the first seal may also be formed using the hybrid bonding processes. In these cases, the first seal also includes a metal oxynitride layer disposed along an interface 224 between the first surface 206 of the dielectric body 202 and the surface 216 of the first optical window 214.

In some implementations, the first seal includes an anodic bond between the first surface 206 of the dielectric body 202 and the surface 216 of the first optical window 214. In some implementations, the dielectric body 202 is formed of a glass comprising silicon oxide (e.g., $SiO_2$, $SiO_x$, etc.) and the first optical window 214 includes silicon oxide (e.g., $SiO_2$, $SiO_x$, etc.). In these implementations, the example vapor cell 200 includes a layer of silicon (e.g., amorphous silicon) disposed between the first surface 206 of the dielectric body 202 and the surface 216 of the first optical window 214. The first seal includes an anodic bond between the layer of silicon and one or both of the first surface 206 of the dielectric body 202 and the surface 216 of the first optical window 214.

The example vapor cell 100 of FIGS. 1A-1D and the example vapor cell 200 of FIGS. 2A-2B may be manufactured using a process for bonding an optical window to a dielectric body. The process may, for example, be used to bond the optical window 104 to the dielectric body 102 when manufacturing the example vapor cell 100 of FIGS. 1A-1D.

Figure 3:
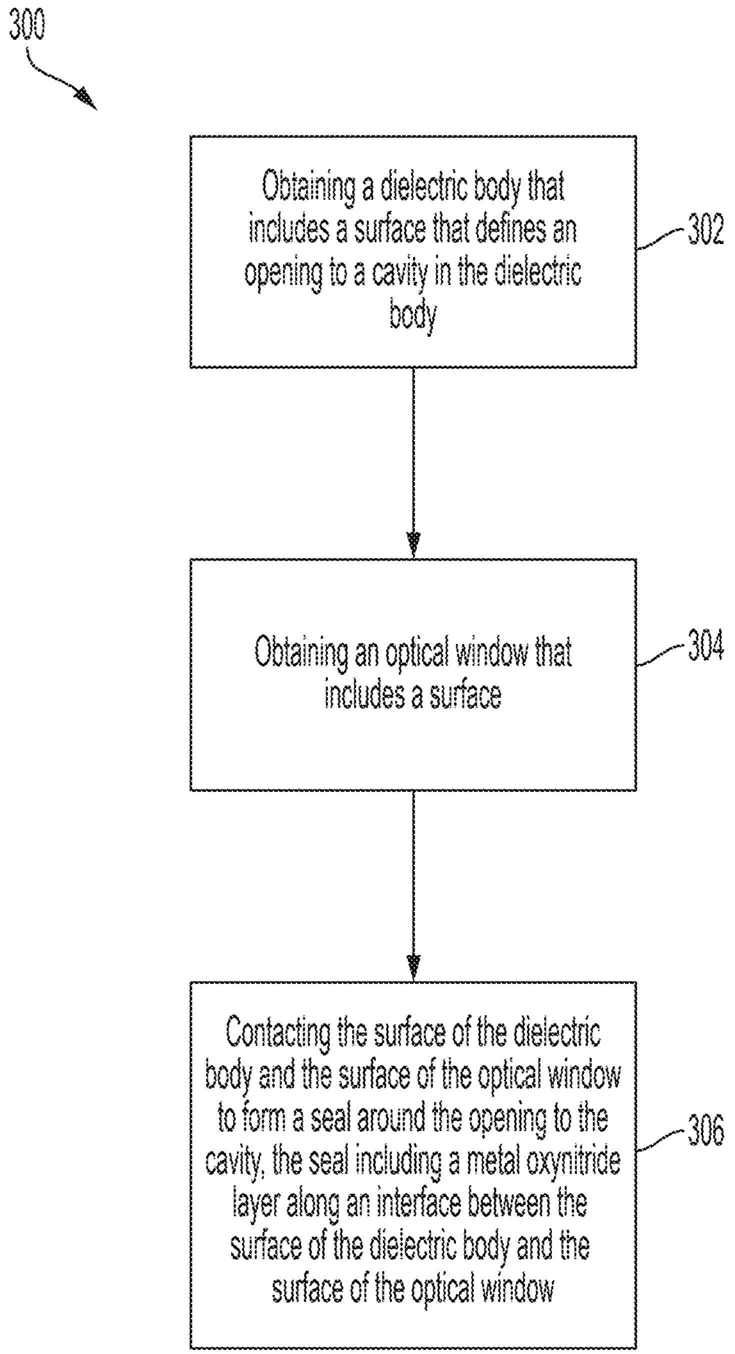
FIG. 3 is a flowchart of an example process for bonding one or more optical windows to a dielectric body of a vapor cell.

The process may also be used to bond one or both of the first and second optical windows 214, 218 to the dielectric body 202 when manufacturing the example vapor cell 200 of FIGS. 2A-2B. FIG. 3 presents a flowchart of an example 300 of the process. The example process 300 is a hybrid bonding process and may involve low temperatures (e.g., less than 200° C.). For instance, and as shown by block 302, the example process 300 includes obtaining a dielectric body that includes a surface that defines an opening to a cavity in the dielectric body. The cavity is configured to contain a vapor of the vapor cell. The example process 300 also includes obtaining an optical window that includes a surface, as shown by block 304. The example process 300 additionally includes contacting the surface of the dielectric body and the surface of the optical window to form a seal around the opening to the cavity, as shown by block 306. Such contact results in a bonded interface between the surfaces of the dielectric body and the optical window that includes the seal. Such contact also includes, in many cases, covering the opening of the cavity with the optical window to enclose the cavity. The seal includes a metal oxynitride layer along an interface between the surface of the dielectric body and the surface of the optical window. The metal oxynitride layer results from a reaction between the surfaces during contact. In some instances, this reaction is driven further by a post-contact bonding process. For example, heat may be applied to the surfaces of the dielectric body and optical window after their contact. As another example, a voltage may be applied between the surfaces after their contact. In some instances, the seal is formed at a temperature below 150° C. (e.g., T ~125° C.). In some instances, the seal is formed at a temperature between 100° C. and 150° C.

In some implementations, and before contacting the surfaces, the example process 300 may include exposing the surface of the dielectric body and the surface of the optical window to a sequence of plasmas to produce respective altered surfaces. The sequence of plasmas may define, or be part of, a plasma treatment process in which the surfaces experience two or more plasma treatments according to a predetermined sequence. The sequence of plasmas includes an oxygen plasma and a nitrogen plasma, and in certain cases, the oxygen plasma precedes the nitrogen plasma. In these cases, the sequence of plasmas may define a plasma treatment process in which the surfaces are first exposed to the oxygen plasma and then to the nitrogen plasma. Exposing the surfaces to the sequence of plasmas may result in the formation of metal oxygen (e.g., M-O) and metal nitrogen (e.g., M-N) bonds on the surface of the dielectric body and the surface of the optical window, thereby producing their respective altered surfaces. In these implementations, contacting the surfaces includes contacting the altered surface of the dielectric body to the altered surface of the optical window. Such contact may, in certain cases, include reacting the metal oxygen and metal nitrogen bonds to form the metal oxynitride layer of the seal. An additional example of the sequence of plasmas is described in relation to FIG. 4.

In some implementations, the example process 300 includes heating the altered surfaces of the dielectric body and the optical window to a temperature no greater than 150° C. after their contact (e.g., T ~125° C.). The temperature may, in certain cases, range between 100° C. and 150° C. In some implementations, the example process 300 includes applying a voltage between the dielectric body and the optical window after contacting the altered surfaces. The voltage may have a magnitude between 700 Volts to 1500 Volts. In certain cases, the voltage is applied while the altered surfaces are heated to the temperature. In implementations where the voltage is applied, the example process 300 may include the use of conductive paste to improve the effect of the voltage. For example, and with reference to FIGS. 1A-1D, the dielectric body 102 and the optical window 104 may include respective outer perimeter surfaces 116, 118. In these cases, the example process 300 may include applying conductive paste to the outer perimeter surfaces 116, 118 after the altered surfaces of the dielectric body 102 and the optical window 104 are contacted. The conductive paste is configured to electrically couple the dielectric body 102 and the optical window 104. Such coupling may serve to improve the uniformity of the voltage when applied, thereby improving the strength and/or hermicity of the seal that results.

In some implementations, the example process 300 includes disposing the vapor into the cavity of the dielectric body before contacting the surfaces. In some implementations, the example process 300 includes disposing a source of the vapor into the cavity of the dielectric body before contacting the surfaces. The source of the vapor may include a liquid or solid source of alkali metal atoms that produces a vapor or gas of alkali metal atoms when heated or irradiated. The example process 300 may then also include heating or irradiating the source of the vapor after the seal is formed. In configurations where the second cavity is present, the source of the vapor may be disposed in the second cavity before the surfaces are contacted. The second cavity may thus serve as an alternative location to the cavity (or first cavity) for the source of the vapor. In these configurations, and after the seal is formed, the source of the vapor may then be heated or irradiated, thereby allowing the vapor or gas of alkali metal atoms flow through the channel and into the cavity. In some implementations, the example process 300 includes disposing an anti-relaxation coating (e.g., a coating of paraffin) on one or more surfaces of the cavity before contacting the surfaces. Such disposal may occur before the vapor or the source of the vapor is disposed in the cavity.

Vapor cell design and fabrication for Rydberg atom-based RF sensors may be complicated because Rydberg atoms are uniquely sensitive to electric fields and collisions. For example, these sensors may experience line shifts and broadening from electric fields and collisions that reduce their sensitivity and reproducibility. Moreover, the size of the vapor cells may be comparable to the wavelengths of RF electromagnetic fields, which can add to their design intricacy. For a Rydberg atom-based sensor that is intended to sense over a broad frequency range (e.g., about 100 GHz), the vapor cell can easily transition from a Rayleigh scattering regime to a Mie scattering regime, or possibly even an optical scattering regime. Such transition may occur even if the vapor cell uses a dielectric construction (e.g., is formed of dielectric materials). Thus, the vapor cell may require careful engineering of its components.

Furthermore, the form of a vapor cell matters for Rydberg atom-based RF sensors. Line broadening, frequency shifts, RF scattering, unintended alkali metal coatings of the walls, and manufacturing difficulties (e.g., bonding, outgassing, etc.) can hamper efforts to capitalize on the unique advantages offered by Rydberg atom-based RF sensors. Similar issues may exist for vapor cells configured as atomic clocks, magnetometers and gyroscopes. The challenges of manufacturing, design, and production scaling make the development of improved bonding schemes for vapor cell sensors a pressing need. Vapor cells for RF sensing, in particular, can be plagued by electric fields that cause shifts and broadening of the spectral lines and reduce sensitivity and accuracy. Background gases remaining in the vapor cell may also broaden the spectral lines.

In some implementations, the vapor cells may be manufactured using a low-temperature bonding process that reduces the outgassing of the vapor cells. The low-temperature bonding process may also allow the application of low temperature passivation coatings to the internal cavity of a vapor cell. In these implementations, the low-temperature bonding process may rely on temperatures of no greater than 200° C. (e.g., about 125° C.). Lower temperatures, however, are possible. An example of the low-temperature bonding process is described in relation to FIG. 3. However, additional examples are described below in relation to FIGS. 4-15. In some implementations, the low-temperature bonding process allows for the bonding of vapor cells suitable for quantum sensors. These sensors may include anti-relaxation coatings to prevent nuclear spin depolarization and binding of alkali atoms to internal surfaces of the vapor cells. The low temperature bonding process can also reduce the outgassing of vapor cell materials, thereby reducing the internal gas pressure. This reduction of internal gas pressure may reduce collisional dephasing. Typical low temperature anodic bonding of MEMs vapor cells takes place well above 200° C. Thus, the low-temperature bonding process may provide advantages for the bonding MEMs vapor cells.

Achieving a robust bond strength and ensuring a reliable hermetic seal are important criteria for the fabrication of alkali-based vapor cells. Anodic bonding processes typically require high temperatures, often exceeding 350° C. to increase the internal energy of chemical bonds at a bonding interface. These high temperatures limit the applications where anodic bonding can be used. Even in cases where anodic bonding is performed just above 200° C., which may compromise the ultimate bond strength, the temperatures are too high to preserve many vapor cell coatings. Moreover, high temperatures can introduce significant challenges and limitations in addition to the application of coatings. For example, alkali metals, which are essential for the functioning of an alkali metal vapor cell, are highly reactive and volatile at elevated temperatures. Their reactivity can lead to the degradation or contamination of the alkali metal vapor, which in turn, can lower the performance and longevity of a fabricated vapor cell. Additionally, high temperature processes can induce thermal stress and warping of materials, resulting in poor bonding quality and reduced device reliability. The combination of high heat and high voltages during anodic bonding can damage optical coatings as well. Anodic bonding may even drive alkali metal atoms meant for sensing electromagnetic fields into the walls of a vapor cell, changing the walls chemically.

These challenges may be addressed by bonding processes that include low temperature bonding by surface modification. An example of such bonding processes is described above in relation to FIG. 3 (i.e., example process 300). Low-temperature bonding by surface modification allows for the fabrication of high-quality vapor cells with minimal internal stress and enhanced durability. In certain cases, the low temperature bonding processes may be coupled with certain aspects of anodic bonding processes. By reducing the bonding temperature, it is possible to maintain the integrity of alkali metals in a vapor cell and avoid thermally induced damage to substrate materials that form the components of the vapor cell. Using lower temperatures for anodic bonding typically results in weaker bonds and impractical process parameters, such as high voltages and extended bonding durations. The resulting bond strength may also be low, and it is difficult to minimize or eliminate the bubbles or cavities at the bonding interface. To overcome these challenges, an interfacial layer may be combined with a sequential plasma treatment to produce a facile bonding interface. The interfacial layer may enhance the bonding strength while allowing the bonding process to occur at lower temperatures. Moreover, this interfacial layer may act as a mediating layer, facilitating the adhesion between the substrate and a bonding material without requiring extreme processing conditions. By optimizing the plasma process parameters and the properties of the interfacial layer, it is possible to achieve strong, durable bonds at reduced temperatures, thereby preserving the integrity of the materials involved and improving the overall efficiency and feasibility of the bonding process. Such capabilities not only improve the overall performance and stability of a fabricated vapor cell but also expand the range of compatible materials and device designs. Consequently, the bonding processes support the continued innovation and optimization of atomic clocks, quantum sensors, and other precision instruments that rely on alkali-based vapor cells, particularly by adding coatings to the internal cavities of the vapor cells.

In some implementations, the bonding processes include a low-temperature bonding process for bonding components of a vapor cell to each other. For example, the low-temperature bonding process may be used to bond a stack of layers to each other. Examples of the stack of layers includes Si/$SiO_2$//glass layers and glass//a-Si/glass layers. Such bonding may, in certain cases, utilize a series of interfacial layers, enhanced by plasma treatment to modify their surface characteristics. Moreover, these interfaces can be combined (along with glass/Si anodic bonding) to construct hermetically sealed vapor cells. For example, the low-temperature bonding process may be used as a final bonding process after anodic bonding to seal a vapor in a vapor cell. The low-temperature bonding process may be configured to optimize bonding strength and reliability, such as by including a tailored plasma treatment to carefully control the interaction between mating surfaces. In certain cases, this treatment may cleanse and activate the bonding surfaces. The treatment may also introduce specific functional groups or surface states by creating a monolayer of metal oxynitride material (e.g., silicon oxynitride). The monolayer may promote strong intermolecular adhesion at the bonding interface. In some implementations, the plasma treatment is applied to a substrate which alters its bonding characteristics to enhance the bond strength and hermeticity of the sealed interfaces at lower temperatures. By precisely engineering these interfacial layers and their plasma-modified surfaces, the bonding processes may advance the field of manufacturing vapor cells for applications such as atom-based sensors, atomic clocks, magnetometers, and so forth. As such, the bonding processes may offer a robust way for creating bonded structures with improved mechanical integrity and thermal stability.

Interfacial layer selection and plasma treatment parameters may be considered to achieve and optimize the performance of the bonding processes. The interfacial layers, specifically silicon oxide (e.g., $SiO_2$) for glass-silicon bonding and amorphous silicon (e.g., a-Si) for glass-glass bonding, may play a role in facilitating strong and reliable adhesion. Moreover, plasma treatment modifies the surface properties of these interfacial layers before contact, enhancing their bonding characteristics through controlled activation and functionalization. Deposition and/or growth techniques may also play a role in ensuring the uniformity and precision of the thin film layers, while controlling residual film stress and surface roughness.

In some implementations, the bonding processes may be applied to $SiO_2$ modified and a-Si modified layers. However, other metal oxide layers (e.g., $TiO_2$) are also possible. The use of a-Si layers may be beneficial as this type of layer has a native oxide that grows on its surface when exposed to an ambient atmosphere.

In some implementations, the bonding processes are applied to a thermally-grown silicon oxide material (e.g., $SiO_x$, $SiO_2$, etc.) for glass and silicon bonding. For example, thermally grown silicon oxide (e.g., $SiO_2$) is a widely used material in the bonding of borosilicate glass and silicon due to its excellent thermal and chemical stability, making it ideal for creating robust interfaces in microfabrication processes. When bonding glass to silicon, $SiO_2$ may act as an effective intermediary layer that helps to mitigate the mismatch in thermal expansion coefficients between the two materials. This property may thus prevent mechanical stress build-up during thermal cycling, which can otherwise lead to delamination or cracking at the bonding interface. Moreover, $SiO_2$ is compatible with both materials and thereby allows precise control over bonding parameters, such as temperature and pressure. This precise control can ensure uniform bonding across large wafer surfaces. Additionally, $SiO_2$ layers can be tailored in thickness and quality through processes like thermal oxidation, allowing for the fine-tuning of the bonding strength and other properties, as required by specific applications. Besides thermal oxide $SiO_2$, several other interfacial layers can be used to enhance the bonding process and improve an interface's properties. Some of these layers include silicon nitride ($Si_3N_4$), titanium dioxide ($TiO_2$), alumina ($Al_2O_3$), and amorphous carbon/diamond-like carbon (DLC). In many instances, pure metals are unsuitable as they can interfere with the RF signals sensed by a fabricated vapor cell sensor device. Overall, thermal oxide $SiO_2$ stands out as a versatile and reliable choice for interfacial layers in glass-silicon bonding, contributing to the durability and performance of integrated devices in various technological domains.

In some implementations, the bonding processes are applied to an amorphous silicon (a-Si) layer for glass and glass bonding. For example, to improve the bonding quality, a hydrogen-free thin a-Si layer of about 10-100 nm can be deposited at room temperature on the bonding interface of borosilicate glass wafer by a radio frequency (RF) magnetron sputtering process. Without applying the a-Si film, both the bond efficiency and bond strength between glass//glass may be weak. For bonding glass to glass, an amorphous silicon (a-Si) layer can be employed to overcome the limitations of high temperature fusion bonding. Fusion bonding of glass, which relies on direct contact and heating to form bonds, often results in insufficient mechanical strength due to the inherent brittleness of glass and the challenges associated with achieving uniform and defect-free bonding surfaces. The fusion bonding process can be also prone to void formation and surface irregularities, which significantly weaken the bond. Additionally, glass has a relatively low surface energy, making it difficult to achieve the high bonding strength required for reliable performance in the field of quantum technology applications.

The bonding processes may, for example, include depositing a-Si on glass with a surface roughness of less than 0.5 nm. a-Si may seamlessly integrate with high temperature processing procedures due to its well-matched thermal expansion across the bonded layers and minimal thermal strain. The adhesion of the a-Si on glass is also very good. The use of an a-Si layer addresses these challenges by providing a more flexible and uniform bonding interface. The a-Si layer can better accommodate slight mismatches in thermal expansion coefficients between the glass substrates, reducing the risk of stress-induced failures. This flexibility helps to distribute mechanical stress more evenly across the bonded interface, enhancing the overall mechanical strength of the bond. Furthermore, the a-Si layer can be precisely deposited by radiofrequency (RF) magnetron sputtering to create a smooth and continuous bonding surface, minimizing the occurrence of defects and voids. These characteristics result in stronger, more reliable bonds that are advantageous for advanced applications where durability and stability are paramount.

In some implementations, the bonding processes include a sequential plasma treatment process for $SiO_2$/Si bonding interfaces or glass/glass bonding interfaces, such as between two wafers. Plasma treatment involves the ionization of gases in a vacuum chamber to create plasma, which can be used to modify the surface properties of materials. The choice of gas, power, and treatment time are parameters that influence the effectiveness of a plasma treatment. Commonly used gases include oxygen ($O_2$), nitrogen ($N_2$), argon (Ar), and hydrogen (H). Each of these gases can provide distinct surface modifications. The power applied, typically via radio frequency, determines the energy of the plasma, affecting the rate and depth of surface interaction. Treatment time is another factor, as it can dictate the extent to which the surface is modified. For example, a longer exposure may result in more significant changes. These parameters must be carefully controlled to achieve the desired surface characteristics, such as increased wettability, enhanced adhesion, or specific chemical functionalities.

Figure 4:
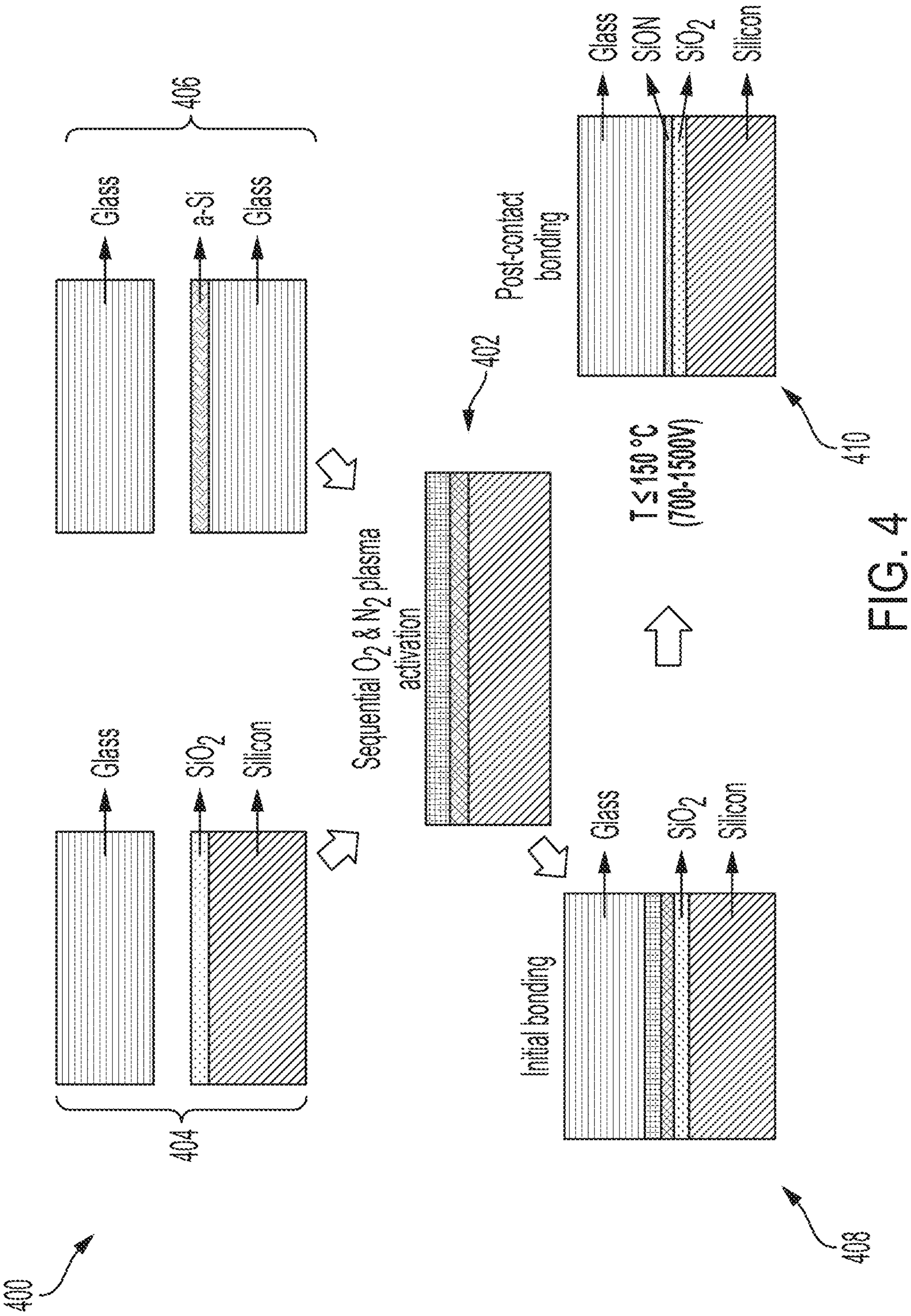
FIG. 4 is a schematic diagram of an example hybrid bonding process that includes a sequential ($O_2/N_2$) plasma activation treatment.

Sequential plasma treatment, and particularly treatments based on the combination of oxygen ($O_2$), and nitrogen ($N_2$) plasmas, can be a sophisticated approach to surface activation. FIG. 4 presents a schematic diagram of an example hybrid bonding process 400 that includes a sequential ($O_2$/$N_2$) plasma treatment 402. The example hybrid bonding process 400 may, in certain cases, be analogous to the example process 300 described in relation to FIG. 3. Moreover, the example hybrid bonding process 400 may be applicable to various architectures. FIG. 4 presents two examples of possible architectures. On the left side of FIG. 4, a first architecture 404 is represented by a top body of glass and a bottom body of Si. A layer of $SiO_2$ is disposed on the bottom body of Si along a surface facing the top body of glass. On the right side of FIG. 4, a second architecture 406 is represented by a top and bottom bodies of glass. A layer of amorphous silicon (a-Si) is disposed on bottom body of glass along a surface facing the top body of glass.

As part of the sequential ($O_2$/$N_2$) plasma treatment 402, an initial oxygen plasma treatment is used to clean the surface and introduce reactive oxygen species (e.g., to increase surface hydroxyl groups), which can form a thin oxide layer. The thin oxide layer may, in certain cases, define an initially-activated surface. This initial treatment is followed by a nitrogen plasma treatment, which further modifies (e.g., activates) the surface by introducing nitrogen-containing functional groups. The sequential ($O_2$/$N_2$) process 402 may thus create a highly reactive and hydrophilic surface, which is beneficial for applications requiring strong adhesion, such as bonding components of a vapor cell together. The synergy between the two plasma treatments results in enhanced surface properties that are not achievable with a single plasma treatment alone. By carefully optimizing the gas composition, power, and treatment duration for each treatment step, sequential plasma treatment can significantly improve the performance and reliability of bonded interfaces. FIG. 4 depicts the bottom bodies of the first and second architectures 404, 406 as receiving the sequential plasma activation treatment 402. However, the top bodies of the first and second architectures 404, 406 may also receive the sequential plasma activation treatment 402.

The example hybrid bonding process 400 also includes an initial bonding process 408 in which the bonding surfaces of the top and bottom bodies are brought into contact with each other. Such contact initiates a reaction along an interface between the bonding surfaces, thereby starting the formation of a silicon oxynitride layer. In certain cases, such as shown in FIG. 4, the example hybrid bonding process 400 may additionally include a post-contact bonding process 410 to enhance the reaction at the interface. The post-contact bonding process 410 may include applying heat to the top and bottom bodies after contact. In many cases, the post-contact bonding process 410 is a low temperature bonding process, and as such, heat is applied such that the temperature of the top and bottom bodies does not exceed 200° C., and preferably no greater than 150° C. The post-contact bonding process 410 may also include applying a voltage between the top and bottom bodies (e.g., a voltage between 700 V and 1500 V). In some variations, the heat and the voltage are applied simultaneously. FIG. 4 presents the initial and post-contact bonding processes 408, 410 in the context of the first architecture 404. However, other architectures are possible (e.g., the second architecture 406).

In some implementations, the bonding processes described herein include the low temperature bonding of glass-silicon interfaces using a thermal oxide (e.g., $SiO_2$) as an interfacial layer. In some implementations, the bonding processes include the low temperature bonding of glass-glass interfaces using a-Si interfacial layer.

Hybrid plasma activated wafer bonding may include an oxygen-nitrogen plasma activation that is followed by initial bonding at room temperature. Such wafer bonding may be combined with electric field assisted bonding at temperatures as low as 125° C. to achieve void-free and strong glass//$SiO_2$/Si wafer bonds. For example, commercially available p-type Si: B<100> orientation wafers, having a high resistivity, were obtained with both sides polished. The silicon wafer had a diameter of 4 inches and was 1.5 mm thick with a surface roughness (RMS) no greater than 0.2 nm. A p-type wafer may be chosen because, in many cases, the wafer has better contact properties with a glass wafer than an n-type Si wafer. Double side polished borosilicate glass was obtained from Schott. The glass wafer was a borosilicate MEMpax wafer having a diameter of 4 inches and a thickness of 500 μm. The surface roughness was less than 0.5 nm. The primary constituents of the borosilicate glass are $SiO_2$ (81%), $B_2O_3$ (13%), $Na_2O/K_2O$ (4%), and $Al_2O_3$ (2%). MEMpax has high ion mobility and closely matches the coefficient of thermal expansion of silicon. Moreover, MEMpax was designed for anodically bonding silicon to glass. The silicon and glass wafers are first visually inspected for chips, micro-cracks, and scratches. After inspection, but prior to the $SiO_2$ thermal oxide growth on the silicon wafers, the wafers were wet cleaned using solvents. The wafer cleaning procedure begins with ultrasonication using acetone, methanol, isopropanol (IPA), and de-ionized water (DI water) in series cleaning process. After ultrasonication, the wafers are dried with a nitrogen ($N_2$) flush. In order to remove particles, organic residues, and other contaminants, the silicon wafers are subsequently cleaned and hydrophilized in RCA (Standard Clean-I) solution (5:1:1 mixture of $H_2O:NH_4OH:H_2O_2$) and (Standard Clean-II) solution (5:1:1 mixture of $H_2O:HCl:H_2O_2$) at a temperature of 75-80° C. for 15 min, followed by a deionized water (DI) rinse before being dried with pure nitrogen gas ($N_2$) in a cleanroom environment.

Modification of the clean silicon substrate surface starts by growing a thin film of $SiO_2$ by a thermal oxidation process. The thin film of $SiO_2$ can be grown and/or deposited by vacuum techniques such as magnetron sputtering, evaporation, or ion beam sputtering, as well as plasma enhanced vapor deposition and atomic layer deposition. Silicon may have a native oxide layer that can be used, but silicon oxide grown by thermal oxidation is more controlled and therefore preferred.

Thermal oxidation of $SiO_2$ may provide several advantages over sputtering for wafer bonding applications. For example, the thermal oxidation of $SiO_2$ may provide a higher quality oxide. When compared to sputtered oxide, thermal oxidation yields a denser, more homogenous, and higher-quality $SiO_2$ layer. The higher quality oxide layer results in better electrical and mechanical properties, which are crucial for wafer bonding. The thermal oxidation of $SiO_2$ may also provide an improved interface. Thermally grown $SiO_2$ forms a superior interface with the underlying silicon substrate, as it grows directly from the silicon rather than being deposited on top. Achieving a good interface is very beneficial to achieving a strong bonding strength. The thermal oxidation of $SiO_2$ may additionally offer precise thickness control. The thermal oxidation process allows for more precise control over the oxide thickness, which is important for many applications requiring specific oxide thicknesses. Moreover, the thermal oxidation of $SiO_2$ may reduce the defect density at the interface and provide better uniformity. Compared to sputtered oxides, thermal oxides typically have a lower defect density, which can enhance the bonded device's performance and reliability. Thermal oxidation produces more uniform oxide layers across the wafer surface compared to other vacuum techniques, which can have issues with thickness variations. In some variations, the thermal oxidation of $SiO_2$ may provide compatibility with high-temperature processes. Thermal oxides can withstand higher temperatures, which is beneficial for subsequent processing steps and applications requiring high-temperature stability. Other advantages are possible.

During some implementations of the bonding processes, a high quality 50-nm layer of low stress and low roughness-silicon dioxide ($SiO_2$) is grown on both sides of the polished silicon wafer. The thermal oxide is a silicon oxide film produced by the oxidation of substrate silicon, at a temperature around 1100° C. The "dry" oxidation process may, for example, be represented by $Si+O_2 \rightarrow SiO_2$. The silicon oxide layer is formed as oxygen atoms penetrate the silicon surface, and oxidize it, creating a layer of $SiO_2$.

Figure 5A:
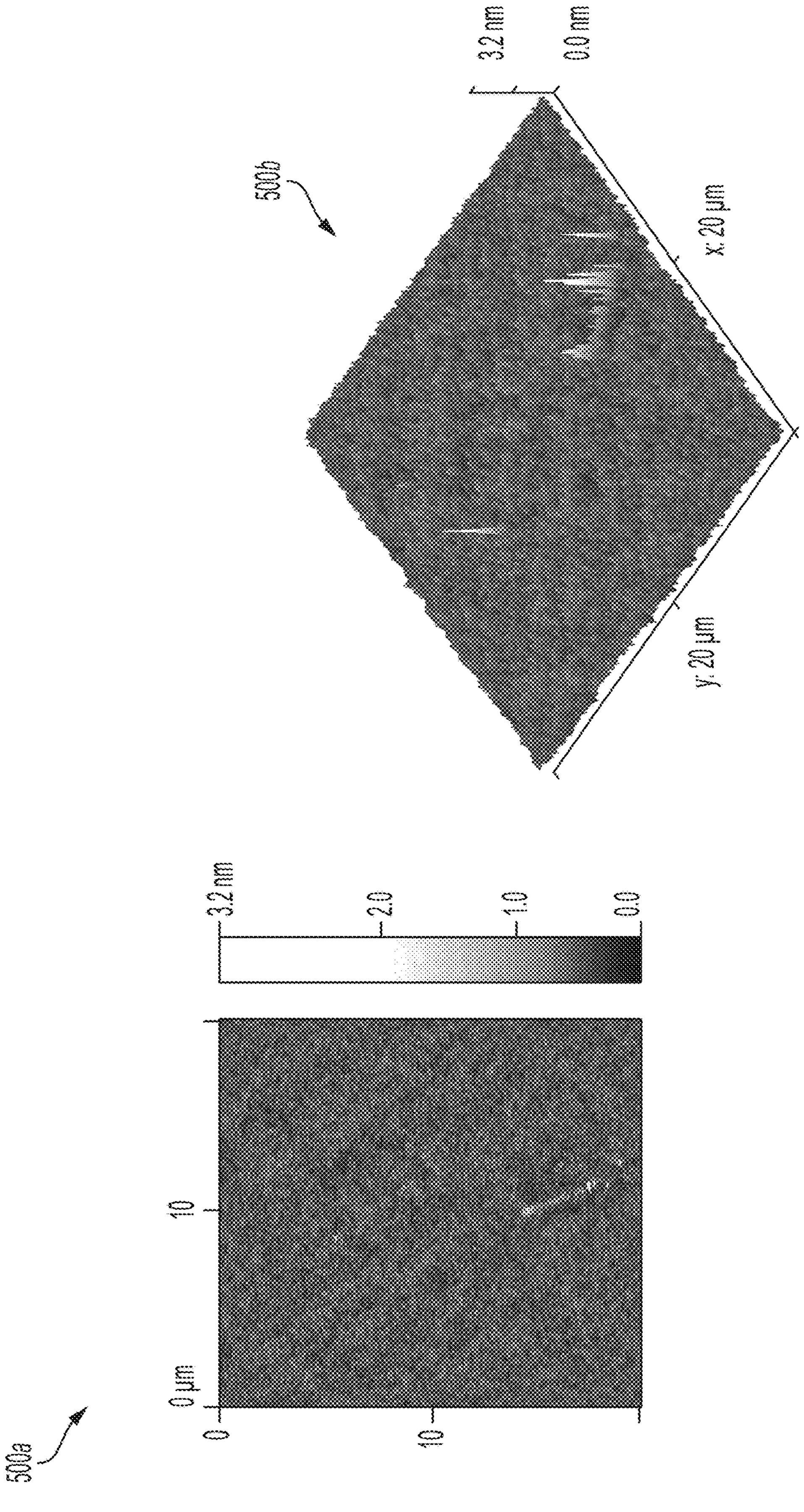
FIG. 5A shows two images, generated using atomic force microscopy, of an example surface morphology of a 20×20 $\mu m^2$ area of a 50-nm thick dry thermal oxide of $SiO_2$.
Figure 5B:
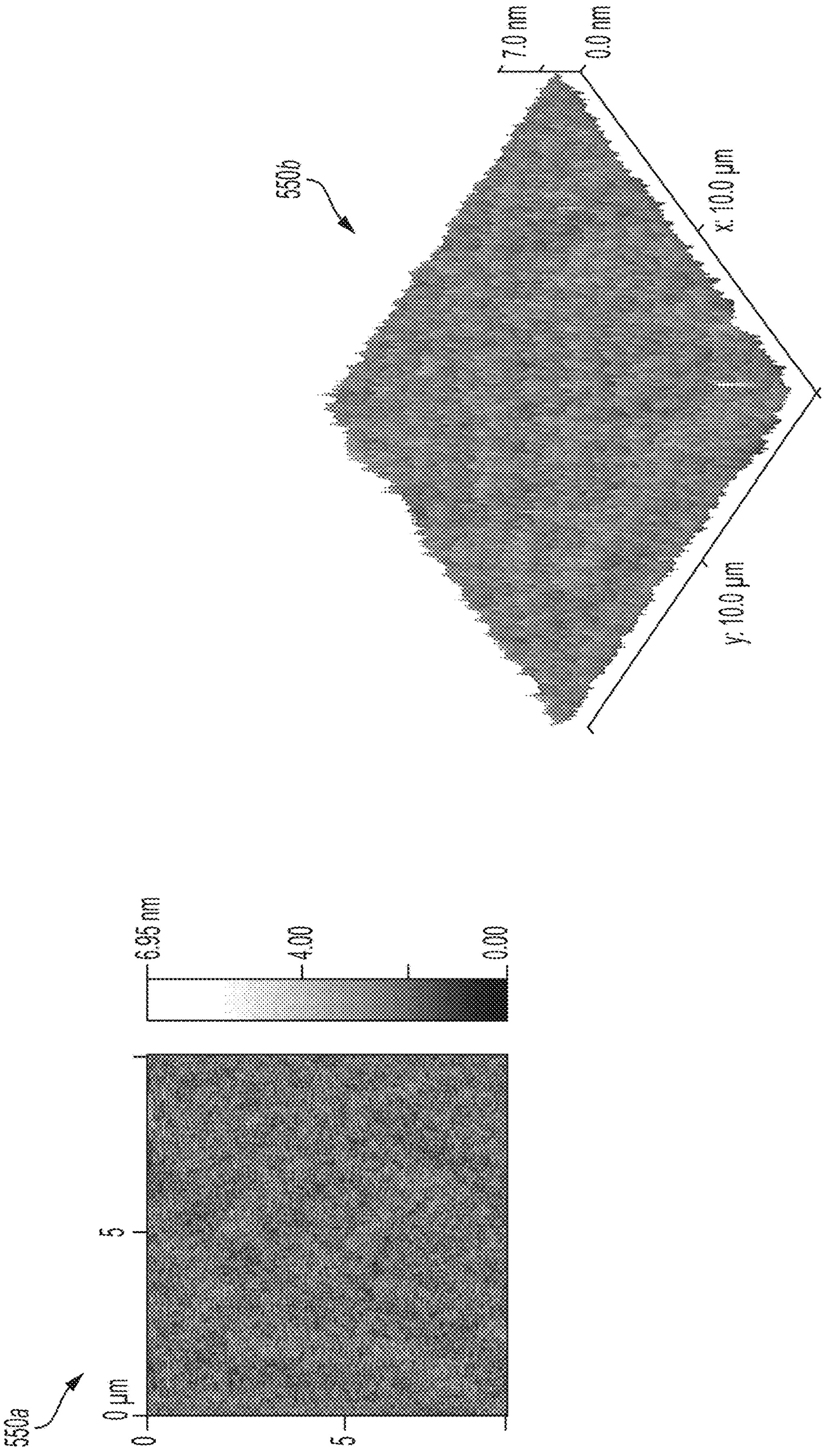
FIG. 5B shows two images, generated using atomic force microscopy, of an example surface morphology a 10×10 $\mu m^2$ area of a 100-nm thick a-Si layer.

The surface roughness of the as-grown $SiO_2$ is typically 0.15 nm, as shown in FIGS. 5A and 5B. FIG. 5A presents two images, generated using atomic force microscopy, of an example surface morphology of a 20×20 $\mu m^2$ area of a 50-nm thick dry thermal oxide of $SiO_2$. The left side of FIG. 5A shows a first image 500*a*, in top-down view, of the as-grown $SiO_2$ surface. The right side of FIG. 5A shows a second image 500*b*, in perspective view of the as-grown $SiO_2$ surface. The images 500*a*, 500*b* were generated using a Cypher Oxford atomic force microscope (AFM). The RMS Roughness ($R_q$) value of 0.15 nm for a dry oxidized silicon dioxide ($SiO_2$) surface indicates that the surface has a very low level of roughness. The fact that such a low $R_q$ value was obtained after dry oxidation of $SiO_2$ is a positive indicator of high-quality oxidation. It suggests that the oxidation process resulted in a smooth and uniform oxide layer with minimal surface irregularities. Upon completion of the thermal oxidation process, a dicing saw was used to cut the $SiO_2$/silicon wafer into suitable sizes (e.g., dimensions of 10 mm×20 mm) for bonding applications. After dicing, the $SiO_2$ coated silicon chips were cleaned ultrasonically by solvent cleaning using methanol, acetone, isopropanol, and DI water, each for 10 mins. The chips were then dried with $N_2$ gas to remove particles and other contaminants on the surfaces. Further adherence of any dust particles/residues on the surfaces from the environment were then cleaned with methanol, acetone, and isopropanol using cleanroom swabs (e.g., laundered knitted polyester) from Berkshire Engineered. The chips were finally rinsed with DI water.

To improve the bonding quality of a glass-glass interface, a hydrogen-free thin a-Si layer of about 10-100 nm is deposited at room temperature on the bonding interface of a glass wafer. The deposition was conducted by an RF magnetron sputtering technique, and a example of the a-Si layer is shown in FIG. 5B. FIG. 5B presents two images, generated using atomic force microscopy, of an example surface morphology a 10×10 $\mu m^2$ area of a 100-nm thick a-Si layer. The left side of FIG. 5B shows a first image 550*a*, in top-down view, of the 100-nm thick a-Si layer. The right side of FIG. 5B shows a second image 550*b*, in perspective view of the 100-nm thick a-Si layer. Amorphous silicon may have a surface roughness of less than 0.5 nm and integrates with high temperature processing procedures due to its well-matched thermal expansion across the bonded layers with minimal thermal strain. A 2-inch pure silicon target (99.995% purity) bonded to a copper (Cu) backing plate, purchased from AJA were used to deposit the a-Si layer. To enhance the adhesion properties, reduce the surface roughness, remove surface contaminants, and/or other irregularities in the a-Si interlayer, an in-situ pre-etching process was conducted for 300 seconds. This process involved the application of 50 watts of power using a mixture of Ar and $O_2$ at a pressure of 30 mT. The power and pressure parameters are carefully selected by optimization to achieve the desired etching rate and surface modification while avoiding excessive damage to the underlying layers. The a-Si thin film was deposited exclusively in an argon gas environment, with a constant pressure of 3 mT maintained during deposition. Deposition times ranging from 100 to 300 seconds were employed to attain varying thicknesses. Upon completion of the a-Si deposition, a dicing saw was used to cut the a-Si coated glass wafer into suitable sizes for bonding the vapor cells.

Immediately after $N_2$ drying, the chips—whether a-Si coated glass chips or $Si/SiO_2$ chips—were transferred to the plasma activation chamber to avoid further surface contamination. The surface activation was accomplished using a wafer level plasma cleaner. Before bonding glass to $SiO_2/Si$, both the glass substrate and the $Si/SiO_2$ chip surfaces were sequentially activated using the plasma treatment, with 60 seconds each of oxygen and nitrogen plasma. For the glass/a-Si bonding architecture, the bare glass substrates were cleaned with oxygen plasma for 60 seconds, while the a-Si coated glass was treated with both oxygen and nitrogen plasma for 60 s and 40 s each. The RF power of the plasma cleaner was set at around 400 watts, and the chamber pressure was maintained at about 360 mTorr. Oxygen and nitrogen gas were introduced sequentially into the plasma treatment chamber at a volume rate of about 180 and 90 sccm. After activation by plasma exposure, the pair of chips was removed from the plasma cleaner. In many instances, the surface is highly hydrophilic. In these instances, further hydroxylation of the surface is not necessary (e.g., by rinsing and/or dipping the activated surface in DI water).

In some implementations, the bonding processes include bonding two surfaces together. Since the initial bonding can be highly sensitive to the cleanliness of the surface, both the plasma activated surface of $Si/SiO_2$ and glass/a-$Si/SiO_2$ were placed inside a flow hood. Such placement can avoid the accumulation of dust particles on the surface before the initial bonding processes. The chips were brought into contact with the glass substrate at room temperature by placing the silicon (or a-$Si/SiO_2$) chip with the activated interfacial layers surface facing upwards, while the glass surface is placed on top. As soon as the contact is initiated, the interference fringe pattern between the layers can be observed. To enhance the strength of the initial bond, a firm pressure is applied by pressing the altered surfaces against each other. A complete, tight seal between the two activated surfaces is formed without any fringes or unbonded areas. The seal also did not include bubbles, such as due to gas trapped between the two-mating glass//$SiO_2$ surfaces. However, the bonding strength is weak because of the low bond energy of hydrogen bonds and silicon hydroxy bonds (e.g., Si—OH). Increased bonding strength was achieved when plasma activation was combined with a low temperature anodic-like bonding process. The bonding mechanism for a conventional anodic bonding process involves intricate interplay between charges and chemical reactions at the interface. The resulting electrostatic interactions and chemical affinities facilitate the formation of covalent bonds, particularly siloxane bonds, at the interface. However, the anodic-like bonding process described here involves the formation of silicon oxynitride bonds.

The pre-bonded chips are placed between two plates (e.g., graphite as anode and a metallic disk as a cathode) which are connected to a DC power supply (Stanford systems, USA) to initiate the low temperature anodic-like bonding processes. First, the $SiO_2/Si$ and the glass chip were connected to the positive and negative electrodes, respectively. The bonded pairs are heated simultaneously to increase the mobility of the positive ions in the glass substrates. When the temperature is stabilized at about 125° C., a DC voltage of −1500 V is applied to the electrodes and the current between the electrodes is measured for a bonding time of 90 minutes. The bond process is completed when the current decays to a residual value of around 0.002 mA. No external mechanical force is applied to put the wafers in contact during the bonding process, except for the weight of the electrode. Subsequently, the wafers are allowed to cool down to ambient temperature.

After bonding, the bonded pairs were subjected to a crack-opening test (Maszara razor blade test) to evaluate their bond strength. The test involves inserting a razor blade between the two bonded wafers, pulling them apart, and then assessing fracture toughness and/or interface integrity of the bonded wafers. The test shows that bond strength remains notably high at lower temperatures (125° C.), with fractures primarily occurring within the bulk glass rather than at the interface between the two mating wafers. In contrast, for surfaces treated solely with oxygen or nitrogen, the wafers can be split apart with the razor blade test.

In some implementations, the bonding processes include fabricating vapor cells. For example, a vapor cell may first bond a window to a frame, the so-called 'base frame,' in air. The base frame is then filled with Cs either using a laser activated getter or with pure Cs, and the Cs getter can be activated after the final vacuum sealing of the vapor cell. Chemical processes for filling the vapor cell with Cs are also possible. After filling the base frame, the base frame and a capping window are placed in a bonding apparatus that is pumped down to at least $10^{-3}$ Torr. After the system is pumped down to the desired background pressure, the window and base frame are contacted and then bonded. It is the final bond of the capping window and the base frame that utilizes the low temperature bonding process described previously. However, the bonding processes may include various other processes, such as coating the internal surfaces of the base frame and capping window (e.g., with an anti-relaxation coating). These coatings can require masking to protect the bonding surfaces or can be applied after the final bonding step by activation, such as by heating a flake of paraffin that has been placed in the cavity.

Figure 6A:
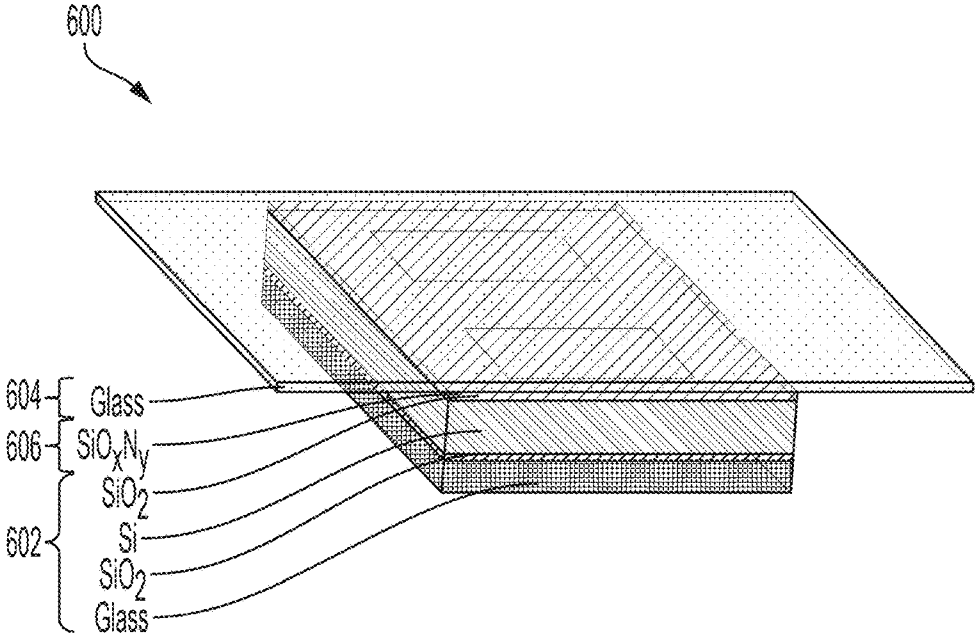
FIG. 6A is a schematic diagram, in perspective view, of an example of a thermal oxide $SiO_2$/Si-based vapor cell fabricated using a hybrid wafer bonding process with a sequentially activated plasma treatment.

In some implementations, the bonding processes include fabricating a silicon-based vapor cell. FIG. 6A presents a schematic diagram, in perspective view, of an example of a thermal oxide $SiO_2/Si$-based vapor cell 600 fabricated using a hybrid wafer bonding process with a sequentially activated plasma treatment. The fabrication of the silicon-based vapor cell 600 may begin with the anodic bonding of a $Si/SiO_2$// glass pair 602, named the "base frame," at a temperature of about 380° C. A DC voltage of 600 V is applied to the electrodes and the current between the electrodes is measured for a bonding time of 20 minutes. This step may be done using anodic bonding since the base frame does not yet have any Cs in it and it is open to air for degassing. The initial bonding step may be used to create a strong, durable bond between the $SiO_2$ and glass. Once the bond is complete, the bonded pair 602 is carefully cleaned with solvents to remove any residues or contaminants. After cleaning of the bonded frame 602, silver (Ag) paste is applied to the sides of the bonded pair 602, which is then cured to ensure proper adhesion of the silver paste to the bonded pair 602. In certain cases, the use of silver paste after the initial bonding of the glass with the $SiO_2/Si$ body serves an important role in the multi-layer bonding process.

After the first bonding step, the silver paste is applied around the bonded glass/silicon interface to create an electrical connection between the silicon layer and the next layer of glass. This connection aids the subsequent low temperature hybrid bonding of the top capping, glass window 604.

Silver paste is conductive, and its application helps to ensure that a uniform electric field can be established across the bonding interface during the window capping process. Other techniques of creating a uniform field, like a number of point electrodes or other types of conductive paste are possible. In many implementations, the conductive paste is fully removed after fabrication of the vapor cell is complete. A uniform field helps to achieve a strong and reliable bond between the top glass layer 604 and the already bonded glass/silicon structure.

Both the top capping glass substrate 604 and the already bonded glass/silicon base frame 602 are first each sequentially activated using plasma treatment. Each bonding surface is activated with 60 seconds each of oxygen and nitrogen plasma to form a thin layer of non-stoichiometric silicon oxynitride ($SiO_xN_y$) 606. The bonded pair 602, now prepared with the silver paste, is loaded into a vacuum chamber along with the top capping, glass substrate 606. The assembly is baked overnight to remove any moisture and/or trapped gases. After the overnight baking process, the vacuum chamber is cooled down, and a small quantity of pure Cs (10-50 nL range) is piezo-electrically dispensed into a side pocket of the bonded structure 602 in the inert environment of a glove box (e.g., a nitrogen gas environment). There are other techniques for dispensing cesium inside the vapor cells, some of the main techniques are: (a) direct filling of liquid Cs using a micropipette under vacuum conditions; (b) solid-state dispenser activation where a small pill-like Cs dispenser (e.g., Cs-getter pill) is placed inside the cell and activated by laser irradiation after cell sealing is completed; (c) UV photolysis of alkali azide; and (d) thermal evaporation using pure Cs metal.

Figure 6B:
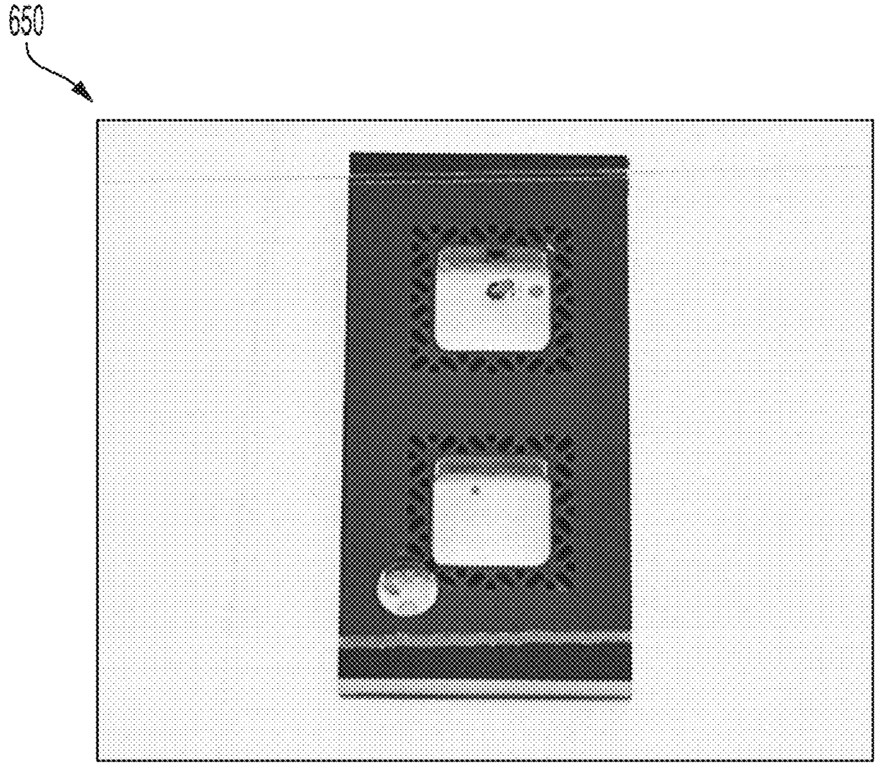
FIG. 6B is a photograph, in top view, of an example thermal oxide $SiO_2$/Si-based vapor cell using a hybrid wafer bonding process with a sequentially activated plasma treatment.

The Cs filled base frame assembly 602 is then loaded back into the vacuum chamber, where the system is pumped down for 10 minutes to remove any air or moisture. Once the vacuum chamber is sufficiently evacuated (about $10^{-6}$ Torr), a manipulator is lowered to make a tight initial contact between the base frame 602 and the top cap glass substrate 604. The temperature is gradually raised to 125° C. so that the complete stack is in thermal equilibrium. Next, a voltage of −1500 V is applied across the structure, initiating the final bonding step, which lasts for 90 minutes. The bonding process is completed when the current passing across the layers being bonded decays to a residual value (e.g., 0.002 mA). The bonded layers are allowed to cool naturally to room temperature, to reduce thermal stress. FIG. 6B presents a photograph, in top view, of an example thermal oxide $SiO_2$/Si-based vapor cell using a hybrid wafer bonding process with a sequentially activated plasma treatment.

Figure 7A:
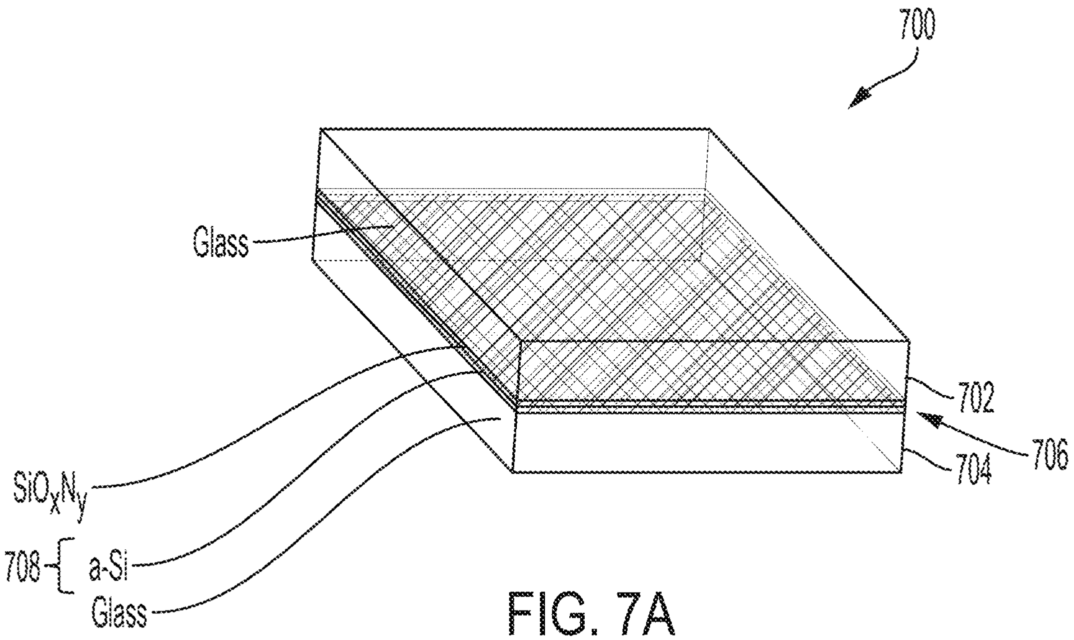
FIG. 7A is a schematic diagram, in perspective view, of an example bilayer bonded device pair of a-Si deposited all glass-based vapor cell fabricated using a hybrid wafer bonding process with a sequentially activated plasma treatment.

In some implementations, the bonding processes include fabricating a-Si deposited glass vapor cells made from stacks. FIG. 7A presents a schematic diagram, in perspective view, of an example bilayer bonded device pair 700 of a-Si deposited all glass-based vapor cell fabricated using a hybrid wafer bonding process with a sequentially activated plasma treatment. The example bilayer bonded device pair 700 includes first and second glass bodies 702, 704 bonded to each other along an interface 706. The first glass body 702 includes an a-Si layer 708 along a surface facing the second glass body 704. The a-Si layer 708 defines a bonding surface of the first glass body 702. The second glass body 704 also includes a bonding surface (e.g., facing the first glass body 702), and the bonding surfaces of the first and second glass bodies 702, 704 are treated before contact by the sequentially activated plasma treatment. The interface 706 includes a silicon oxynitride layer ($SiO_xN_y$) that forms due to a reaction between the a-Si layer 708 and a bonding surface of the second glass body 704. The reaction may be initiated by contact of the bonding surfaces. In many implementations, the reaction is driven further by a post-contact bonding process (e.g., by the application of heat and/or a voltage).

A sputtered amorphous silicon (a-Si) deposited glass vapor cell may, for example, be fabricated using two bonding scenarios. The first scenario involves the bonding process of a simple three-wafer glass layers stack, while the second example addresses the more intricate bonding process of a four-glass wafer stack that includes the process of alkali dispensing and top cap bonding inside the vacuum chamber. These scenarios illustrate the approaches and challenges in developing reliable, hermetic and high-performance vapor cells in the field of quantum technology applications.

In some implementations, the bonding processes include a bilayer bonding process for glass layers (e.g., the example bilayer bonded device pair 700 of FIG. 7A). The bilayer bonding process may, in certain cases, include a substrate cleaning procedure. The substrate cleaning procedure begins with a cleaning process using a swabs and a series of solvents, such as methanol, acetone, isopropanol, and rinsing with de-ionized water. After rinsing, the wafers are dried with a nitrogen gas flush (e.g., pure $N_2$ gas). The deposition of a-Si and the corresponding sputtering process parameters are as described previously. The stack is formed as glass//a-Si/glass//a-Si/glass.

Figure 7B:
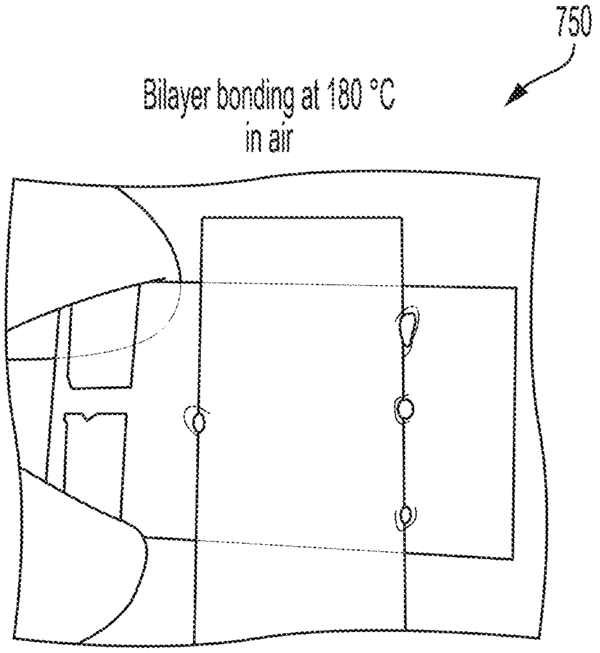
FIG. 7B is a photograph showing, in top view, an example base frame fabricated using of a bilayer bonding process in air at about 180° C.
Figure 7C:
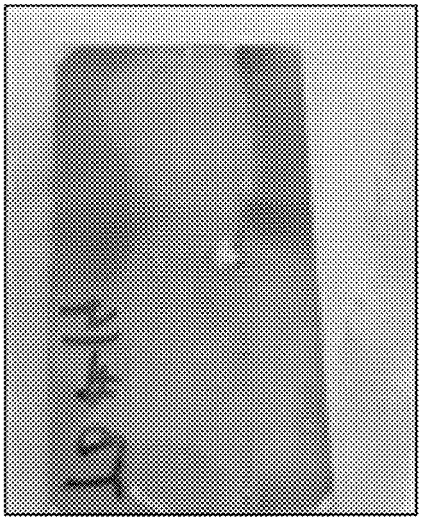
FIG. 7C a photograph showing, in top view, an example vapor cell fabricated using of a bilayer bonding process in vacuum at about 200° C.

In some implementations, the bilayer bonding process is performed under two different environments, e.g., in air and in a vacuum. For the variation conducted in air, the bilayer bonding process may involve using a glass window and a glass frame. The bilayer bonding process in air may begin by stacking these two layers on top of each other with the glass frame coated with a 100-nm layer of sputtered a-Si (amorphous silicon) on each side. The top glass window remains uncoated. The glass layers that are to be bonded are subjected to sequential plasma treatment, first with an oxygen plasma for 60 seconds and then with a nitrogen plasma for 40 seconds. The temperature during the air variation can range from 120° C. to above 400° C., as the substrates can out-gas and there is no Cs present. The air variation can be used to produce a base frame. FIG. 7B presents a photograph 750 showing, in top view, an example base frame fabricated using of a bilayer bonding process in air at about 180° C. For the vacuum variation, the bilayer bonding process can occur at a temperature less than 200° C. and a vacuum level of approximately $10^{-7}$ Torr. However, other vacuum levels are possible. The fabrication under vacuum involves using the base frame and its exposed layer of a-Si with a second glass window that is uncoated. After filling a cavity in the base frame with Cs, the second glass window and the base frame are contacted and then bonded together to hermetically seal the vapor cell. FIG. 7C presents a photograph 770 showing, in top view, an example vapor cell fabricated using of a bilayer bonding process in vacuum at about 200° C.

For bonding processes conducted in air, the treated layers are carefully aligned and stacked together. To enhance the strength of the initial bond, a firm pressure may be applied, pressing the treated surfaces against each other. This results in a 100% initial bond between the two layers, free of voids or fringes. After establishing the initial bond, the entire stack is heated gradually to 180° C. on a hot plate as part of a post-contact bonding process. Once the desired temperature is reached, a high voltage of −700 to −1400 V is applied across the stack for 90 mins. This voltage causes the positively charged sodium ions in the glass layers to migrate away from the interface, leaving behind open oxygen bonds.

The a-Si coatings act as diffusion barrier, preventing sodium ion perturbation at the bonded interfaces, thus preserving bond integrity. These open oxygen bonds then form strong molecular bonds (Si—O—Si and/or Si—N—Si) with neighboring silicon atoms from the a-Si coatings, creating a durable and hermetically sealed bond between the layers.

Upon completion of the post-contact bonding process, the bonding strength of the bonded pairs may be evaluated. For example, the bonded pairs can be subjected to crack-opening test (Maszara razor blade test) to evaluate their bond strength. The test involves inserting a razor blade between the two bonded wafers, pulling them apart from each other, and then assessing fracture toughness and/or interface integrity of the bonded wafers. For the bonded pair shown in the photograph 750 of FIG. 7B, no fringes formed, nor did crack propagation occur during the insertion of the razor blade at various regions. The test indicates that the bond strength remains significantly high even at lower temperatures, as fractures predominantly occur within the bulk glass rather than at the interface between the two mating wafers.

Figure 8:
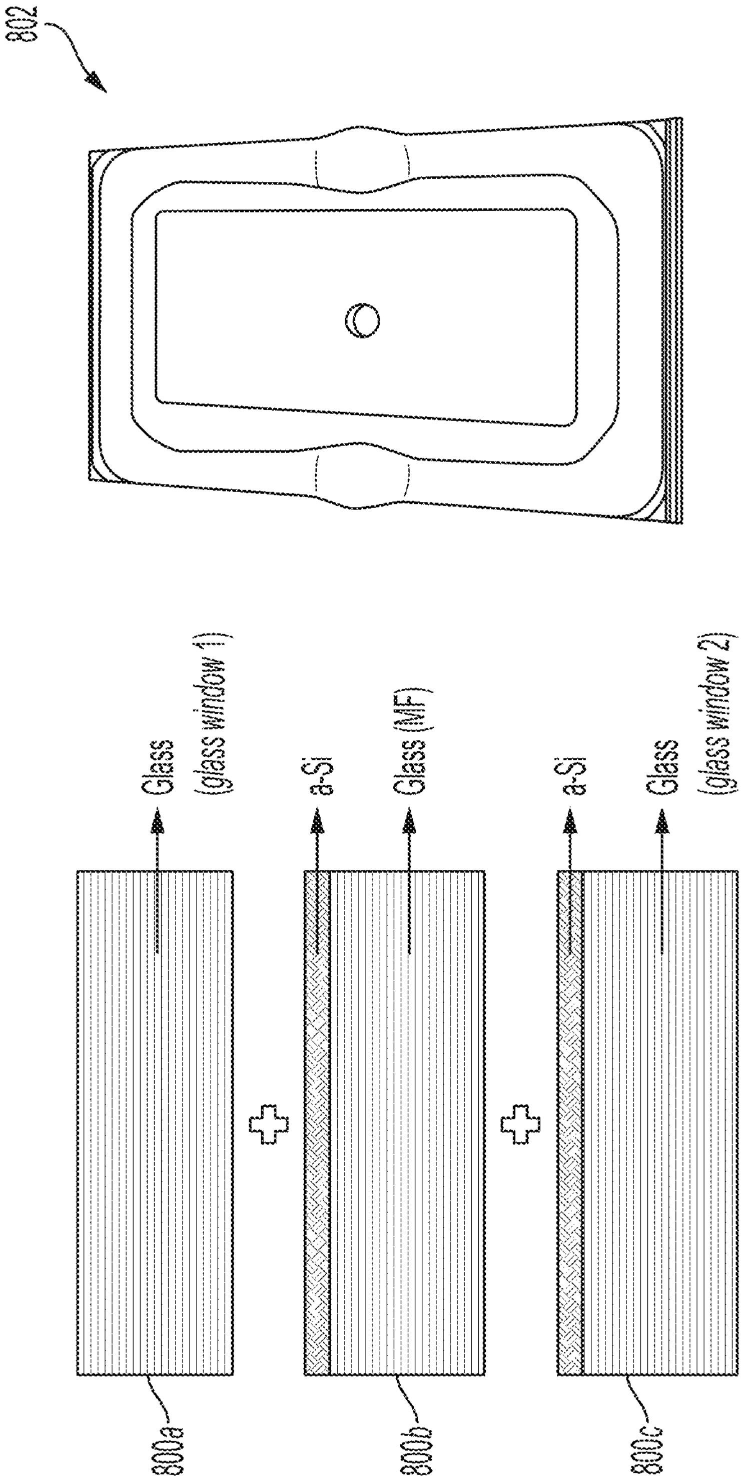
FIG. 8 is a schematic diagram showing an example structure of three layers bonded together to form a vapor cell body.

In some implementations, the bonding processes include bonding three wafer glass layers. FIG. 8 presents a schematic diagram showing an example structure of three layers 800*a-c* bonded together to form a vapor cell body 802. Two of the three layers 800*b-c* include a-Si/glass layer pairs. The layers 800*a-c* may be bonded together using a hybrid wafer bonding process with a sequentially activated plasma treatment. When bonded together, the layers 800*a-c* may form an a-Si deposited all glass-based vapor cell 802. The left side of FIG. 8 shows an expanded view, in cross section, of the three layers 800*a-c*. The right side of FIG. 8 shows a photograph of an example of an a-Si deposited all glass-based vapor cell 802 formed by the three layers 800*a-c* when bonded together.

In some implementations, the bonding processes may be used to bond vapor cells at high temperatures greater than 200° C. For example, to remove organic residues and other contaminants, the glass wafers are subsequently cleaned and hydrophilized in piranha solution (e.g., a 2:1 mixture of $H_2SO_4$:$H_2O_2$) for 10 mins, followed by a deionized water rinse before being dried with pure nitrogen gas ($N_2$) in a cleanroom environment. Prior to the a-Si deposition on to the glass wafers, the chips were wet cleaned using solvents. The wafer cleaning procedure begins with ultrasonication of the wafers in a series of solvents, such as acetone, methanol, isopropanol (IPA), and de-ionized water. After ultrasonication, the wafers are dried with a nitrogen gas flush (e.g. pure $N_2$). The deposition of a-Si and the corresponding sputtering process parameters may be as described above.

The vapor cell fabrication may include, for instance, a middle glass frame of thickness 1.1 mm and a two glass windows of thickness 0.5 mm. The vapor cell is made by stacking up these three layers, which may include a middle frame (e.g., the middle frame 800*b* in FIG. 8) and two glass windows (e.g., first glass window 800*a* and second glass window 800*c* in FIG. 8). The middle frame and one glass window are coated with a 100 nm layer of a-Si (e.g., middle frame 800*b* and second glass window 800*c*), while the upper glass window (e.g., first glass window 800*a*) remains uncoated. Before the bonding processes and/or stacking up of layers, each layer undergoes sequential plasma treatment. For example, the top glass window may be cleaned with an oxygen plasma for 60 seconds, and the a-Si surfaces of the middle frame and the bottom window may be treated with both oxygen and nitrogen plasmas for 60 and 40 seconds sequentially. To bond the layers, they are stacked from bottom to top one by one, first the bottom glass window, then the middle frame with a-Si coating facing up, and finally the uncoated glass top window. An example of this sequence is shown in the left side of FIG. 8. To enhance the strength of the initial bond, a firm pressure is applied by pressing the altered surfaces against each other. A sacrificial glass wafer of 0.3 mm and single-side polished silicon wafer of 0.5 mm were placed on top of the uncoated top glass layer to avoid sodium perturbation and/or contamination from the stainless-steel electrode. After the initial bond is formed, the entire stack is heated gradually to 380° C. on a hot plate. Once this target temperature is reached, a high voltage of −700 to −1000 Volts is applied across the stack for 90 mins. The voltage causes the positively charged sodium ions in the glass layers to move away, leaving the open oxygen bonds at the interfaces. The a-Si coatings act as diffusion barriers for these ions by avoiding the sodium perturbation in the bonded interfaces, thus preserving bond integrity. These open oxygen bonds then form strong molecular bonds (Si—O—Si and/or Si—N—Si) with neighboring silicon atoms from the a-Si coatings, creating a durable and hermetically sealed bond between the layers.

Figure 9A:
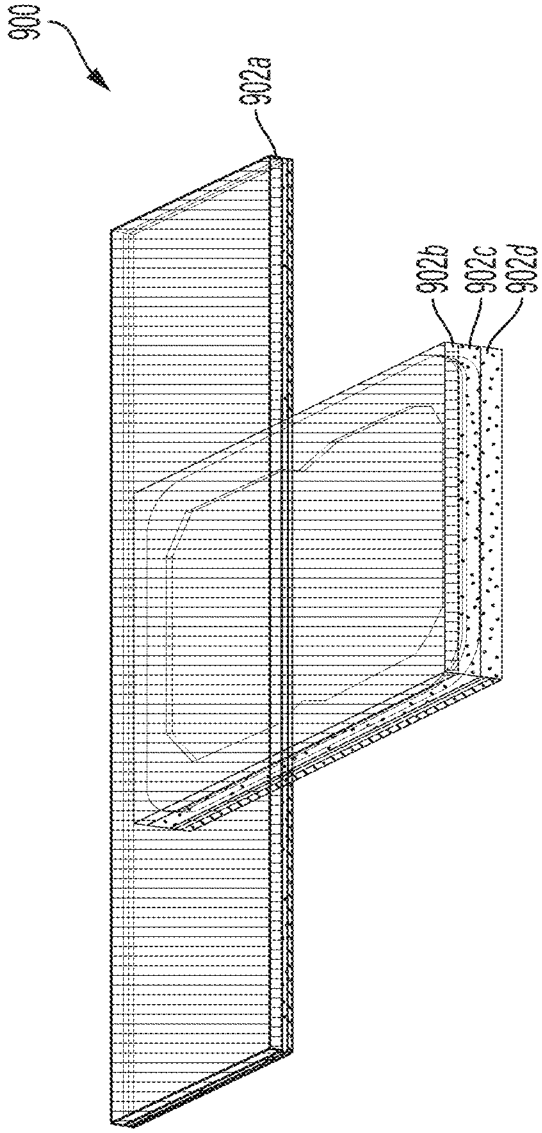
FIG. 9A is a schematic diagram, in perspective view, of an example vapor cell having four glass wafer layers bonded together.
Figure 9B:
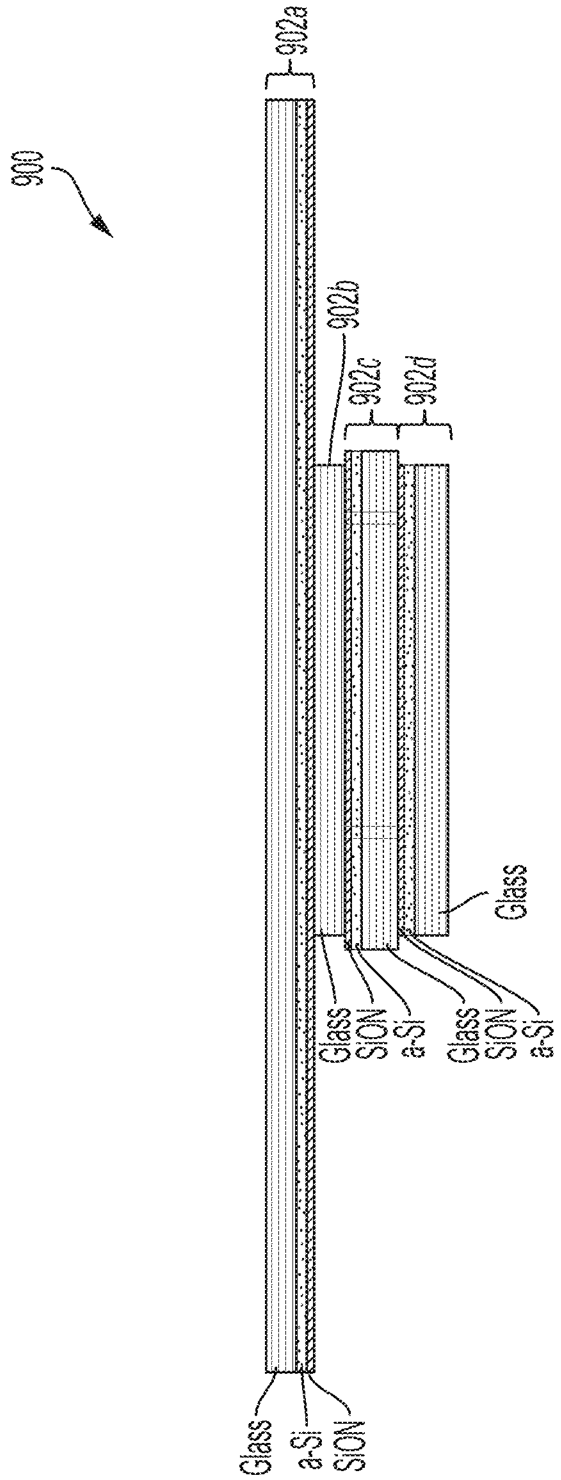
FIG. 9B is a schematic diagram, in cross section, of the four glass wafer layers of FIG. 6A, showing the layers and their interfaces.
Figure 9C:
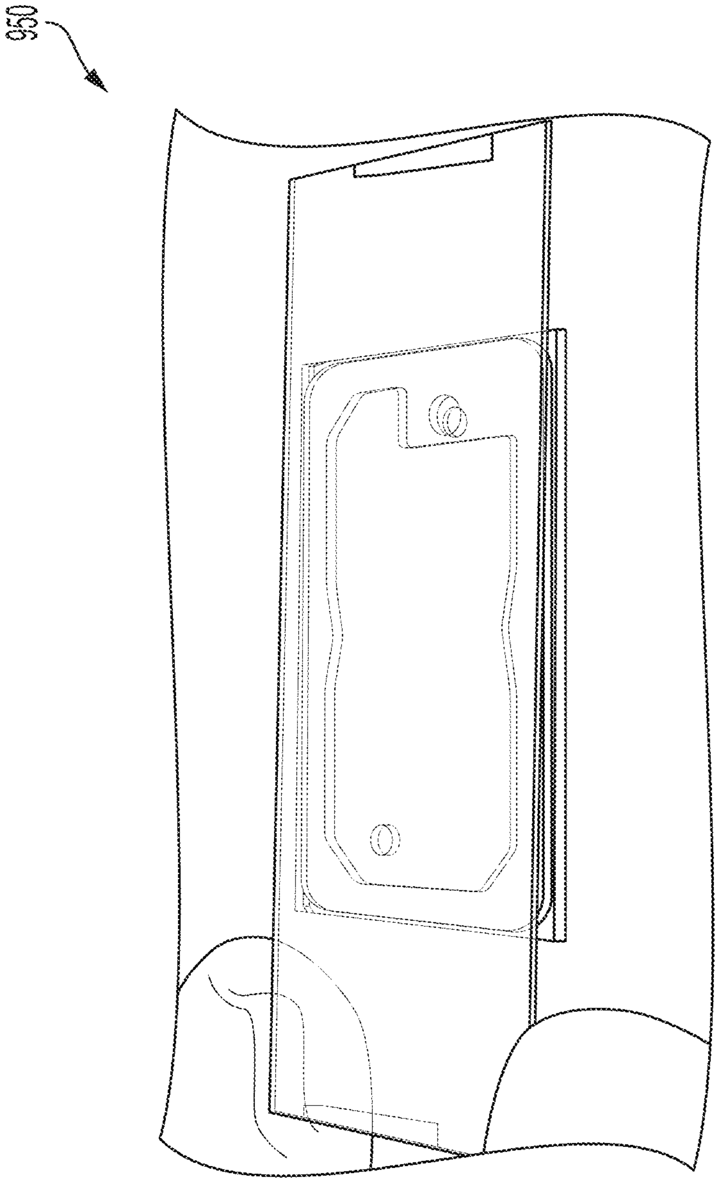
FIG. 9C is a photograph showing an example structure of four glass wafer layers bonded together to form a vapor cell body.

In some implementations, the bonding processes include bonding four glass wafer layers. FIG. 9A presents a schematic diagram, in perspective view, of an example vapor cell 900 having four glass wafer layers 902*a-d* bonded together. FIG. 9B presents a schematic diagram, in cross section, of the four glass wafer layers 902*a-d* of FIG. 9A, showing the materials of the layers and their interfaces. Three of the layers 902*a, c-d* may start with a-Si/glass layer pairs that are subsequently processed to include a silicon oxynitride layer on top of the a-Si layer. FIG. 9C presents a photograph 950 showing an example structure of four glass wafer layers bonded together to form a vapor cell body.

The layers 902*a-d* are bonded together using a hybrid wafer bonding process with a sequentially activated plasma treatment. As preparation for bonding, and to remove organic residues and other contaminants, the glass wafers are subsequently cleaned and hydrophilized in piranha solution (e.g., a 2:1 mixture of $H_2SO_4$:$H_2O_2$) for 10 mins, followed by a deionized water rinse before being dried with pure nitrogen gas in a cleanroom environment. Prior to the a-Si deposition on the glass wafers, the chips were wet cleaned using solvents. The wafer cleaning procedure begins with ultrasonication in a series of solvents, such as acetone, methanol, isopropanol, and de-ionized water. After ultrasonication, the wafers are dried with a nitrogen gas flush (e.g., pure $N_2$ gas). Any remaining dust particles or residues on the surfaces from the environment are then cleaned with isopropanol using cleanroom swabs, followed by a final rinse with deionized water. The deposition of the a-Si layers and the corresponding sputtering process parameters may be as described above.

In some implementations, a vapor cell may be fabricated using a layered structure that includes multiple layers (e.g., from multiple wafers). For example, a vapor cell may be fabricated using four layers in which three layers are first bonded together. A top cap glass substrate is then bonded to the three layers to enclose a cavity in the three layers. The cavity may define an internal volume for containing a vapor of the vapor cell. The three layers may include a middle glass frame of thickness 1.1 mm and two glass windows of thickness 0.5 mm, such as shown in FIG. 8. The middle frame (layer 2) and the bottom glass window (layer 3) are coated with 100 nm of a-Si, while the upper glass cladding wafer (layer 1) remains bare/uncoated. A hole is formed in layer 3 by laser micromachining where the alkali metal source (e.g., Cs) will be placed. The hole may, in certain cases, define a side pocket in the vapor cell. An example of the hole is shown by the second cavity 152 in the dielectric body 102 of FIG. 1D.

Prior to the bonding process, all the layers undergo the sequential plasma treatment process. The bare glass surface (layer 1) is cleaned with an oxygen plasma for 60 seconds, while the a-Si coated glass surfaces on layers 2 and 3 are each treated with both an oxygen and nitrogen plasma for 60 and 40 seconds each. The chips corresponding to layers 1, 2, and 3 are aligned and brought into contact at room temperature by sequentially stacking the layers from the bottom to the top, such as in a sequence from layer 3, to layer 2, and finally layer 1. Each activated surface faced upwards, with the bare glass (layer 1) placed on top, forming two a-Si/glass interfaces. To enhance the strength of the initial bond, a firm pressure is applied by pressing the altered surfaces against each other. The whole stack is placed on the hot plate and homogeneously heated to the bonding temperature of 385° C. The temperature was slowly ramped up in steps of 100° C. to avoid the residual stress and the unwanted wafer curvature of the pre-bonded wafer pairs. When the complete stack is in thermal equilibrium, a high voltage of −1200V is applied to the top and bottom electrode and the current was measured with the bonding time of 160 minutes. Due to the polarity of the applied high voltage, the positively charged sodium ions from the glass layers move away leaving open oxygen bonds at the interfaces between the layers. The sodium ions from the layer 2 and layer 3 also move towards the interfaces but the a-Si coatings act as diffusion barriers for these ions by avoiding the sodium perturbation in the bonded interfaces. The open oxygen bonds from the glass layers can now react with neighboring silicon atoms from the a-Si coating, forming Si—O—Si and/or Si—N—Si bonds. Such bonding leads to a permanent, robust, and high hermetic tight bond between the layers.

After thoroughly cleaning the bonded three-layer glass stack with solvents swabs and subjecting them to a sequential plasma treatment (e.g., $O_2$ and $N_2$), they are loaded inside a vacuum chamber together with the top cap glass substrate. The top capping glass substrate, or window, is coated with a 100 nm thick layer of a-Si, using the sputtering process parameters previously described. The top cap bonding will occur between the glass/a-Si and the bare glass (layer 1) of the stacked bonded pairs. The assembly is baked overnight under vacuum to remove any moisture and/or trapped gases. After baking, the chamber is cooled down, and a pill-like cesium (Cs) getter is placed into a side pocket (e.g., the hole of layer 3) of the bonded structure. The assembly is then loaded back into the vacuum chamber, where the system is pumped down to remove any air or moisture. Once the chamber is sufficiently evacuated (e.g., about $10^{-7}$ Torr), a manipulator is lowered to make a tight initial contact between the stacked bonded pair and the top cap glass window substrate. The temperature is gradually raised to 285° C., or higher, in slow, controlled steps to prevent thermal stress or damage. Once the target temperature is reached, a voltage of 1250 V is applied across the structure, initiating the final bonding step, which lasts for 60 minutes. The bonding process is completed when the current decays to a residual value (e.g., 0.01 mA). The bonded layers are allowed to cool naturally to room temperature to prevent thermal stress and avoid breaking any bonds formed during the bonding process.

Other types of stacks can be made by following this process. Moreover, different numbers of layers can be used. For example, in some configurations, two layers may be the minimum number of layers (e.g., a window layer and a frame layer). In other configurations, three layers may be the minimum number of layers (e.g., a top window layer, a frame layer, and a bottom window layer).

In many implementations, the bonding process includes a sequential plasma activation process capable of activating surfaces for glass, silicon, $SiO_2$/Si, and a-Si layer wafer bonding. FIG. 10 presents a table 1000 that shows examples of parameters for processing silicon and silicon oxide surfaces for bonding. The parameters of sample IDs 2 and 4 correspond to examples of the sequential plasma activation process. The bond strength achieved through sequential plasma activation for various device pairs-including glass//Si(native oxide), glass//$SiO_2$/Si (thermal oxide), and glass//a-Si/glass (native oxide on a-Si) architectures—and demonstrates the effectiveness of this surface treatment in enhancing interfacial adhesion. The bond strengths may, for example, range from 10 to 20 MPa depending on the specific materials and treatment parameters. However, the bond strengths exceed and are comparable to anodic bonding but take place at much lower temperatures.

X-ray photoelectron spectroscopy (XPS) can provide valuable insights into the surface chemical composition and bonding states, allowing the specific modifications induced by the plasma treatments on these different material interfaces to be examined. By analyzing the XPS data, a better understanding can be achieved of the formation of reactive species, the introduction of functional groups, and the changes in surface energy that contribute to enhanced bonding strength in these diverse material combinations. This detailed surface characterization helps to elucidate the mechanisms underlying the improved adhesion observed in sequentially plasma-activated bonding processes. FIGS. 11A-15 show the results of XPS studies on various surfaces of interest to prove that the surfaces have been modified. A description of each of FIGS. 11A-15 is provided below.

Figure 11A:
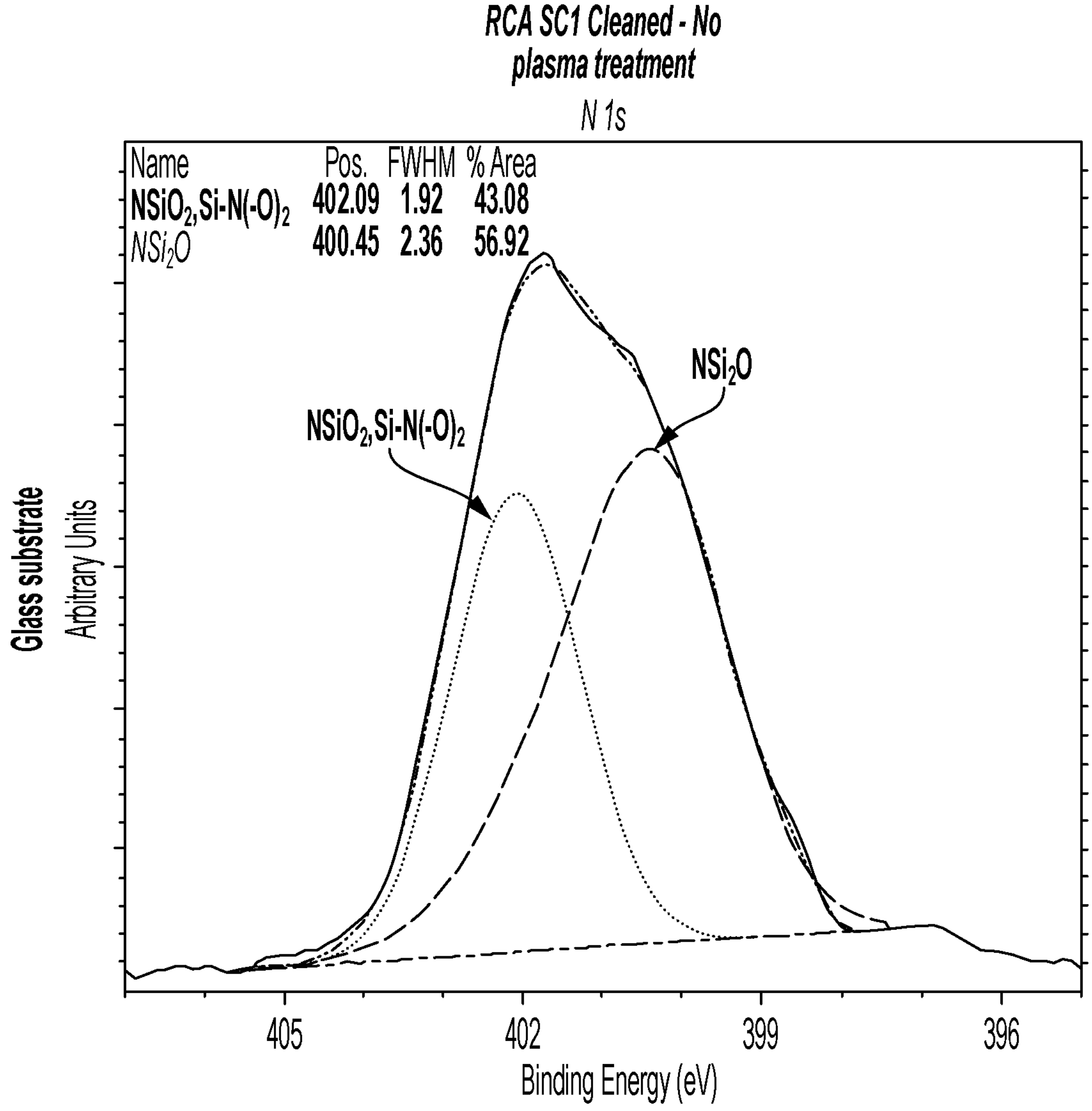
FIG. 11A is a graph showing an example spectrum for a nitrogen 1s core electron level (N1s) in the case of an untreated glass substrate surface that has been cleaned using an RCA (Standard Clean-I) solution.
Figure 11B:
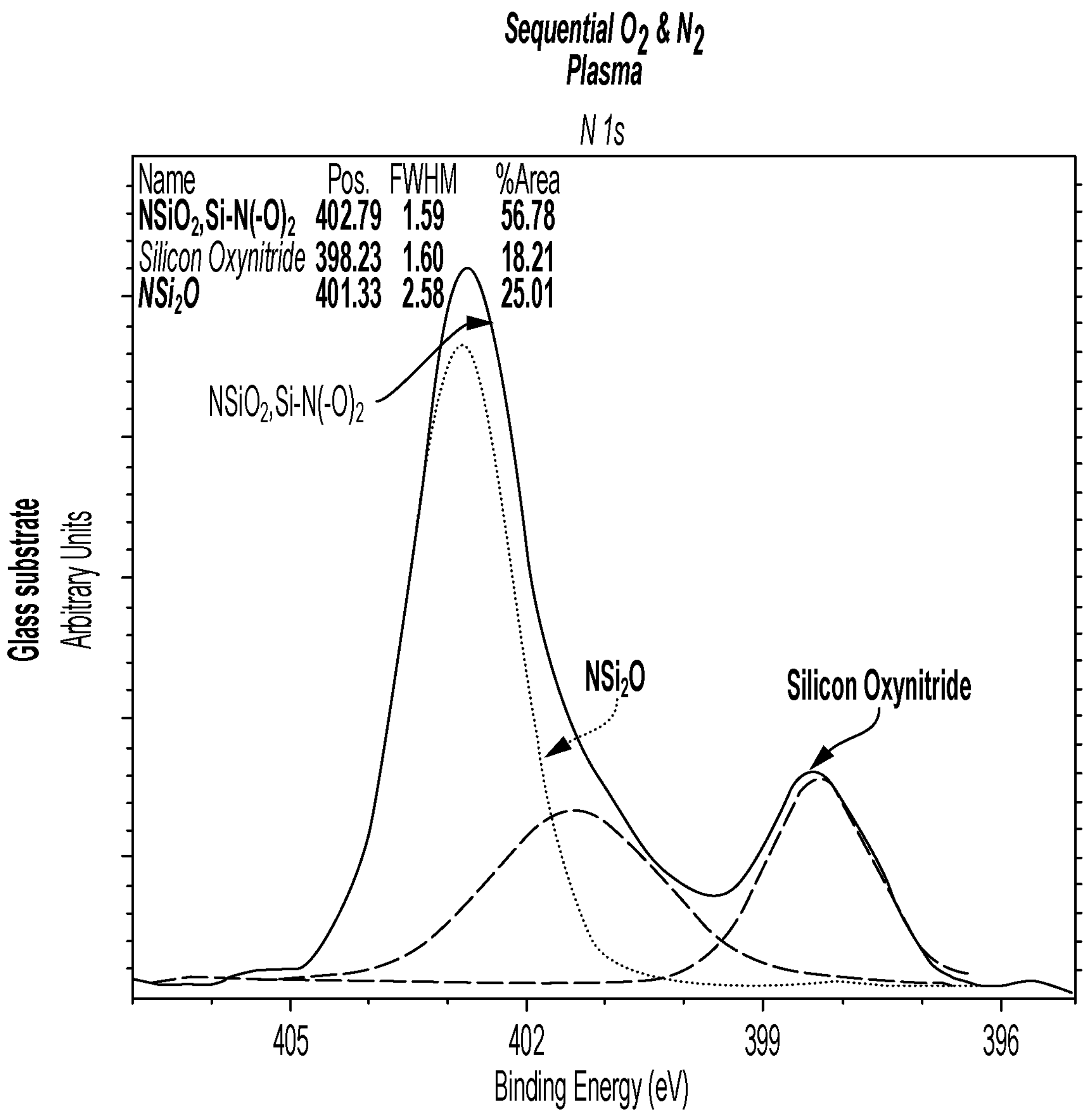
FIG. 11B is a graph showing an example spectrum of a nitrogen 1s core electron level (N1s) in the case of a glass substrate surface that has been cleaned and activated using a sequential plasma treatment.

FIG. 11A presents a graph 1100 showing an example spectrum for a nitrogen 1s core electron level (N1s) in the case of an untreated glass substrate surface that has been cleaned using an RCA (Standard Clean-I) solution. There are a few activated bonding sites that include silicon oxynitride. FIG. 11B presents a graph 1150 showing an example spectrum of a nitrogen 1s core electron level (N1s) in the case of a glass substrate surface that has been cleaned and activated using a sequential plasma treatment. The sequential plasma treatment includes the sequential exposure of the glass substrate to oxygen and nitrogen plasmas. In FIG. 11B, the number of silicon oxynitride bonding sites, as well as other reactive nitrogen containing compounds has increased.

Figure 12A:
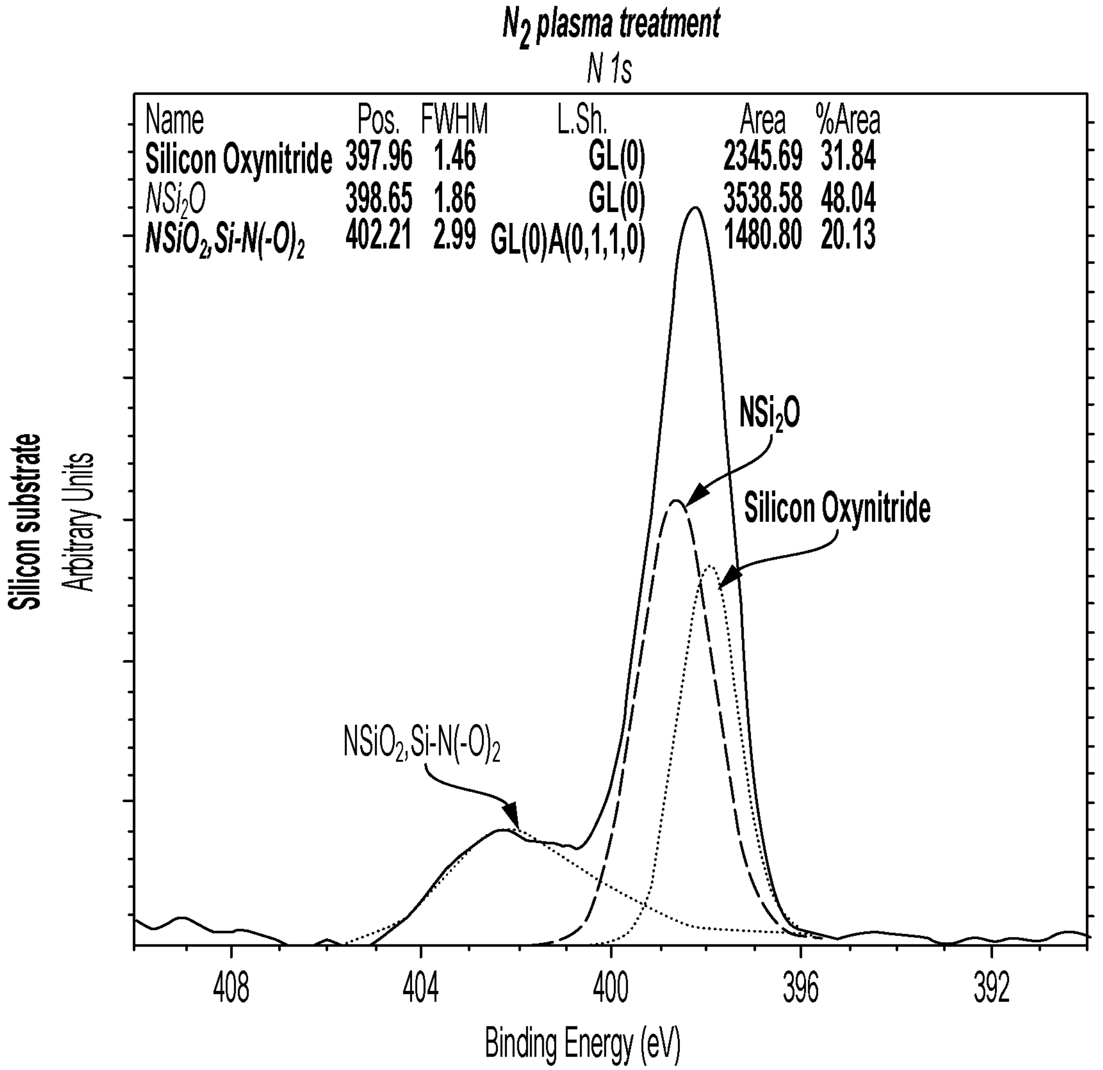
FIG. 12A is a graph showing an example spectrum for a nitrogen 1s core electron level (N1s) in the case of a silicon substrate surface that has been cleaned and activated using a nitrogen plasma treatment.
Figure 12B:
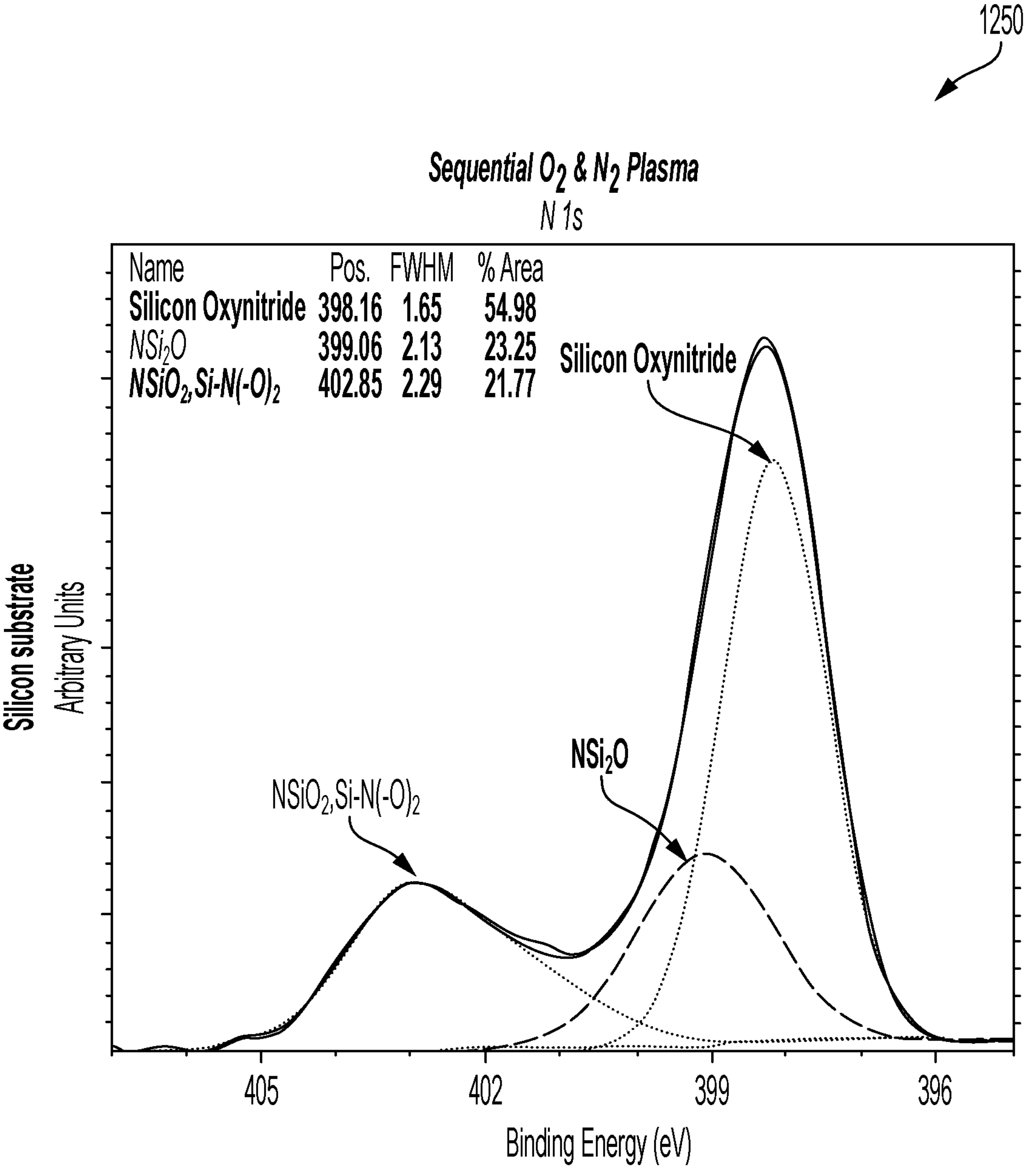
FIG. 12B is a graph showing an example spectrum of a nitrogen 1s core electron level (N1s) in the case of a silicon substrate surface that has been cleaned and activated using a sequential plasma treatment.

FIG. 12A presents a graph 1200 showing an example spectrum for a nitrogen 1s core electron level (N1s) in the case of a silicon substrate surface that has been cleaned and activated using a nitrogen plasma treatment. The nitrogen containing compounds have increased, but the number of reactive sites is not as large as when the oxygen plasma has been applied. FIG. 12B presents a graph 1250 showing an example spectrum of a nitrogen 1s core electron level (N1s) in the case of a silicon substrate surface that has been cleaned and activated using a sequential plasma treatment. The sequential plasma treatment includes the sequential exposure of the silicon substrate to oxygen and nitrogen plasmas. In this case, no measurable amount of nitrogen containing compounds is observed.

Figure 13A:
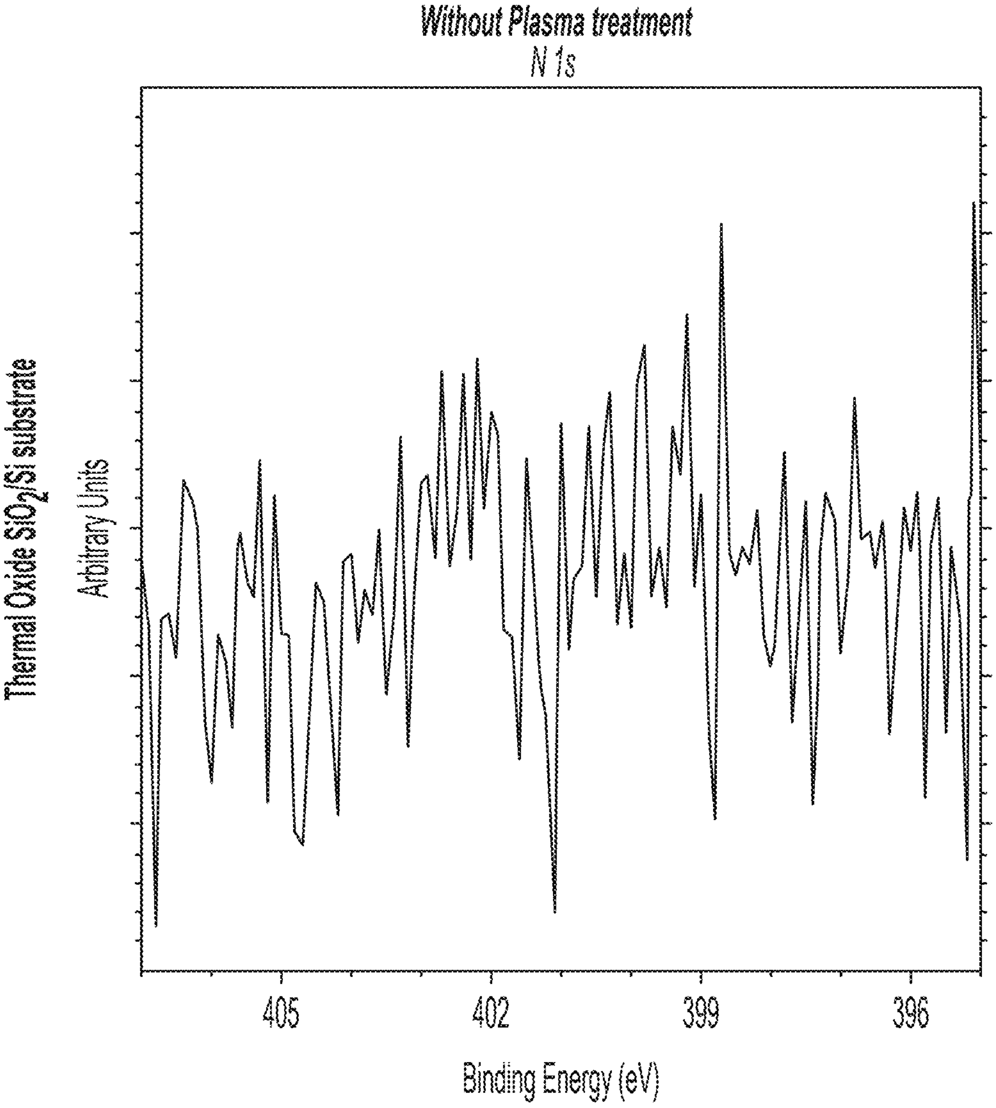
FIG. 13A is a graph showing an example spectrum of a nitrogen 1s core electron level (N1s) in the case of a silicon oxide layer that has been thermally grown on a surface of a silicon substrate but has not experienced a plasma treatment.
Figure 13B:
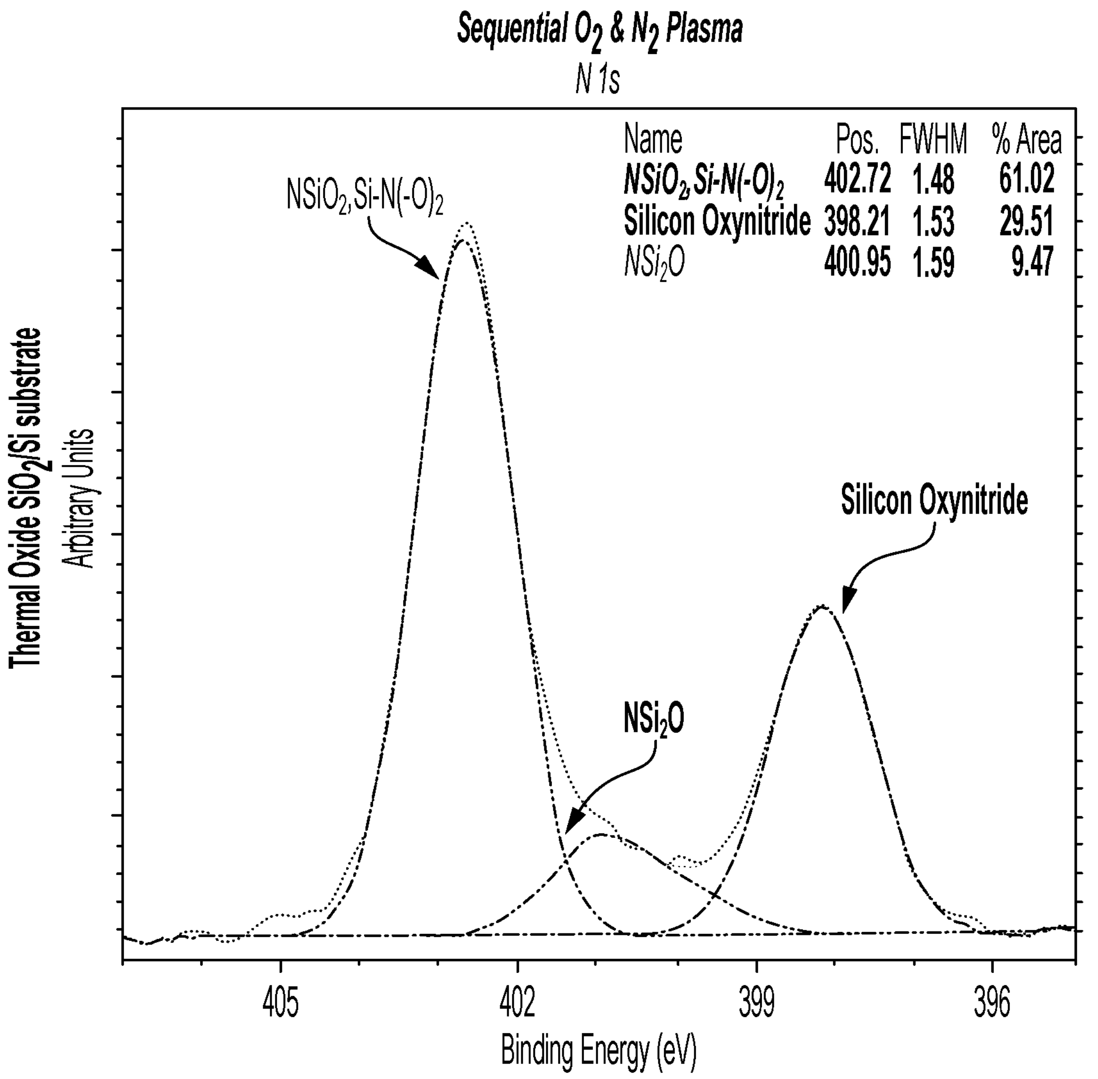
FIG. 13B is a graph showing an example spectrum of a nitrogen 1s core electron level (N1s) in the case of a silicon oxide layer that has been cleaned using a sequential plasma treatment.

FIG. 13A presents a graph 1350 showing an example spectrum of a nitrogen 1s core electron level (N1s) in the case of a silicon oxide layer that has been thermally grown on a surface of a silicon substrate but has not experienced a plasma treatment. FIG. 13B presents a graph 1350 showing an example spectrum of a nitrogen 1s core electron level (N1s) in the case of a silicon oxide layer that has been cleaned using a sequential plasma treatment. The silicon oxide layer has been thermally grown on a surface of a silicon substrate, and the sequential plasma treatment includes the sequential exposure of the silicon oxide layer to oxygen and nitrogen plasmas.

Figure 14:
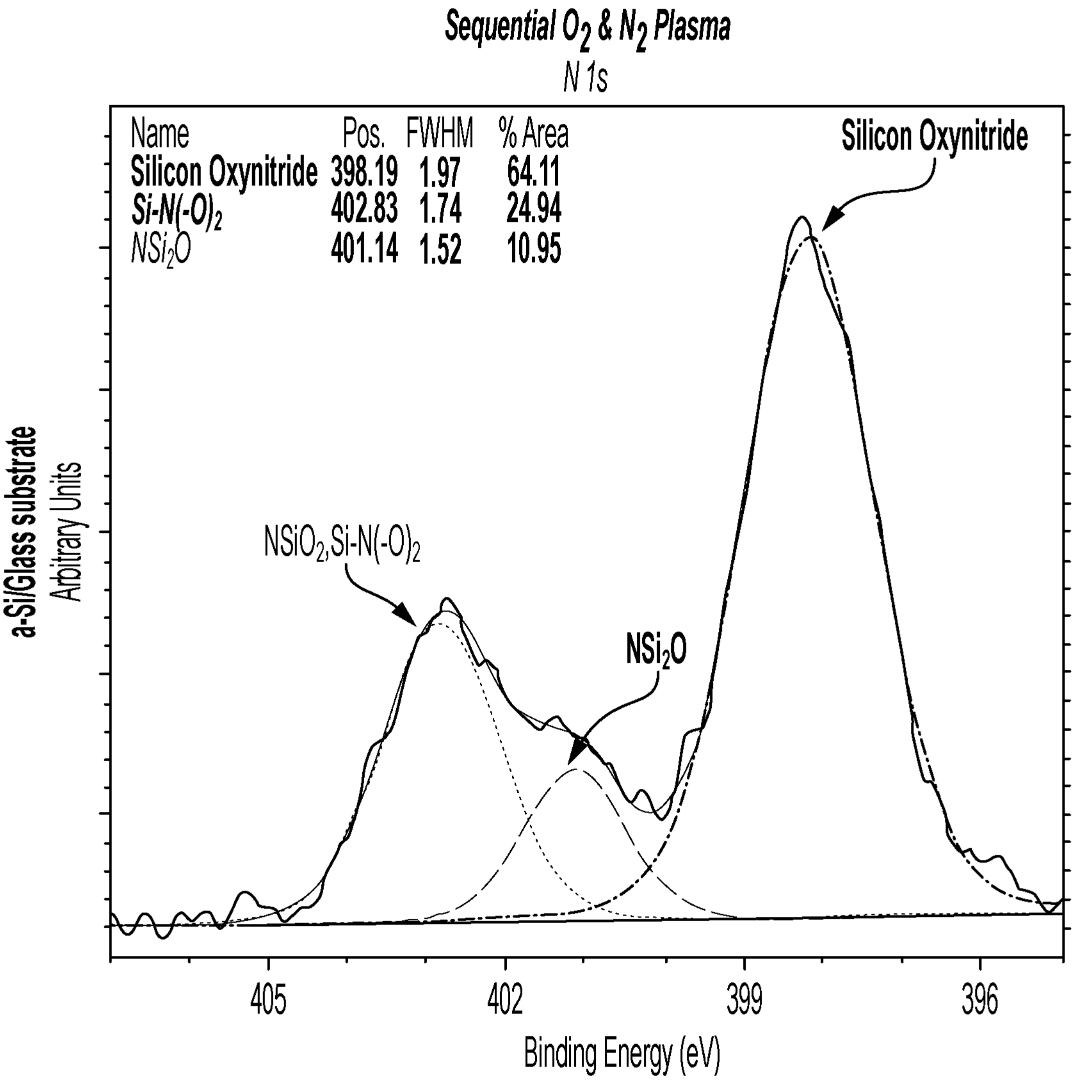
FIG. 14 is a graph showing an example spectrum of a nitrogen 1s core electron level (N1s) in the case of an amorphous silicon layer that has been cleaned using a sequential plasma treatment.
Figure 15:
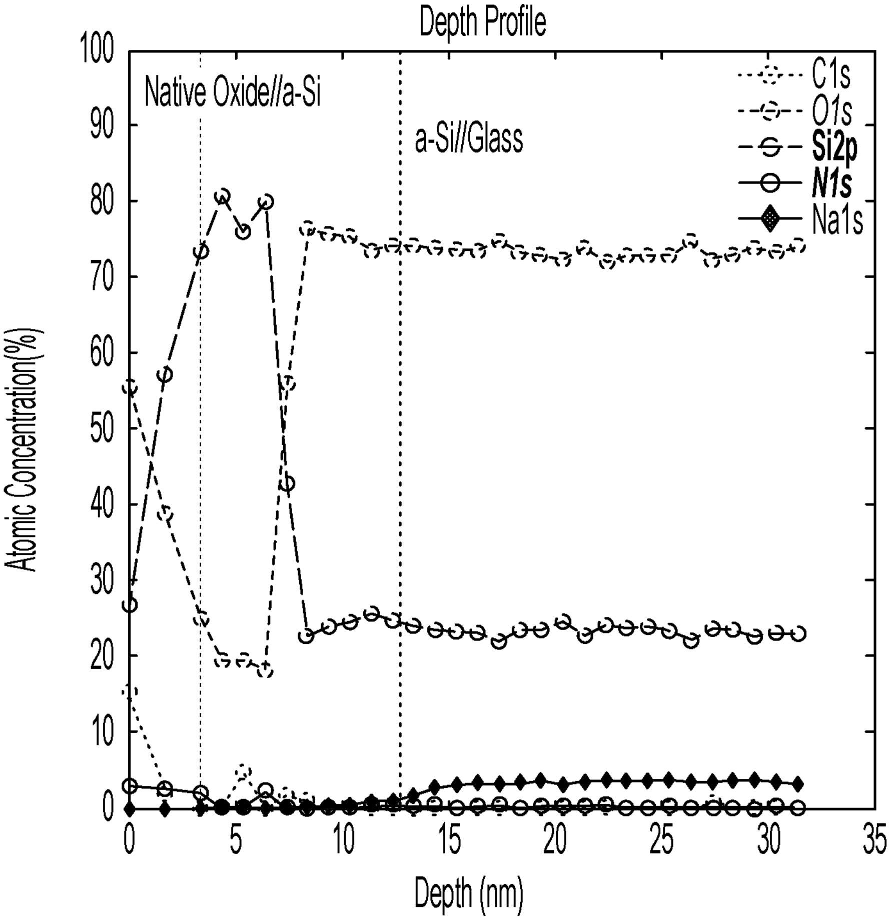
FIG. 15 is a graph of an example depth profile analysis of an amorphous silicon layer that has been cleaned using a sequential plasma treatment.

FIG. 14 presents a graph 1400 showing an example spectrum of a nitrogen 1s core electron level (N1s) in the case of an amorphous silicon layer that has been cleaned using a sequential plasma treatment. The amorphous silicon layer has been grown on a surface of a glass substrate. FIG. 15 presents a graph 1500 of an example depth profile analysis of an amorphous silicon layer that has been cleaned using a sequential plasma treatment. The amorphous silicon layer has been grown on a surface of a glass substrate, and the sequential plasma treatment includes the sequential exposure of the silicon oxide layer to oxygen and nitrogen plasmas.

The surface chemistry and bonding mechanisms are revealed by XPS analysis of intrinsic wafer surfaces as well as the sequentially plasma-treated glass, silicon, silicon dioxide, and a-Si surfaces for bonding. The analysis highlights several findings. First, surface composition changes (e.g., in at. %) indicate that the $O_2/N_2$ plasma treatment of Si, $SiO_2$, and glass surfaces leads to the formation of both oxygen and nitrogen species, creating highly reactive surfaces. Significant shifts in the binding energies of $NSi_2O$, SiON, $NSiO_2$, Si—N(—O)$_2$ species occur on the silicon surfaces. The observation of non-stoichiometric silicon oxynitride ($SiO_xN_y$) after plasma treatment on all the substrate surfaces shows the changes in the chemical environment and bonding states of silicon atoms. The XPS depth profiling data in FIG. 15 also shows that the a-Si surface has a native silicon oxide layer. Moreover, silicon oxynitride bonding is associated with the native silicon oxide layer. The silicon oxide layer may, in many cases, be a silicon oxide adhesion layer.

From the XPS analysis, a significant enhancement is observed in the formation of silicon oxynitride layers on silicon substrates following sequential activation with $O_2/N_2$ plasma treatments, especially when compared to treatments with $N_2$ plasma alone. Specifically, the silicon oxynitride layer formation rate approximately doubled with the sequential $O_2/N_2$ plasma activation process. Furthermore, the analysis shows that the formation rate of silicon oxynitride is higher on silicon surfaces in comparison to borosilicate glass surfaces. Notably, glass surfaces cleaned with only an RCA process did not result in any silicon oxynitride formation. However, the sequential plasma activation process clearly facilitated the formation of silicon oxynitride on the glass surfaces.

XPS analysis also demonstrates that plasma-treated surfaces exhibit high-intensity silicon oxynitride peaks compared to their non-plasma-treated counterparts. This difference indicates that the plasma treatments effectively introduce reactive nitrogen species into the silicon dioxide network, forming silicon oxynitrides that enhance the surface reactivity and bonding potential. For low temperature anodic bonding, the presence of non-stoichiometric silicon oxynitrides is particularly beneficial. These oxynitrides are highly reactive and can readily form strong bonds during the bonding processes. The introduction of plasma treatments before bonding can therefore improve the overall bond strength and reliability.

Additionally, the sequential plasma-treated (a-Si) surface underwent mapping analysis, which effectively demonstrated the formation of a chemically reactive superficial silicon oxynitride layer. This outcome was further substantiated by a detailed depth profiling analysis. The depth profiling data indicated that the average thickness of the surface reactive oxynitride layer is approximately 2-3 nm, corresponding to a few atomic layers. These findings underscore the efficacy of the $O_2/N_2$ plasma activation strategy in tailoring surface properties for advanced applications in the field of quantum technology.

The silicon oxynitride formed by sequential plasma activation can also be advantageous in bonding processes at low temperature (e.g., 200° C. or lower). Increased bonding strength was achieved when the sequential plasma activation was combined with the low temperature anodic bonding process. The XPS analysis reveals insights into how the formation of a thin $SiO_xN_y$ layer through sequential plasma treatments facilitates low-temperature anodic bonding, particularly with $SiO_2$/Si bonding as low as 125° C. The XPS analysis also shows the existence of both oxygen and nitrogen species, as well as the formation of highly reactive surfaces with significant shifts in binding energies. The formation mechanism involves several key processes that enhance bonding efficiency and strength at reduced temperatures. For example, formation of a few nm of $SiO_xN_y$ enhances surface reactivity, increases hydrophilicity, and creates highly reactive species. When the activated surfaces with the thin $SiO_xN_y$ layer are brought into contact at low temperatures (e.g., no greater than 125° C.), initial hydrogen bonding takes place. The hydrophilic surfaces from the hydrogen bonds bring the two mating surfaces into close proximity. Later the process of molecular diffusion by water takes place where the any adsorbed water molecules or those formed by the reaction of hydroxyls diffuse along the interface. A covalent bond may then form in which the reactive species in the non-stoichiometric $SiO_xN_y$ layer—including Si—OH, Si—O—N, and the other Si—NH groups—undergo condensation reactions to form permanent strong covalent Si—O—Si and/or Si—N—Si bonds. The latter covalent process is assisted by the electric field and heat applied to bring the surfaces into close proximity, closer than the hydrogen bonding.

In many implementations, the sequential plasma hybrid wafer bonding process achieves high hermeticity and void-free silicon/$SiO_2$//glass bonds. These bonds have high bonding strength and may be formed at low temperatures. In some instances, temperatures no greater than 200° C. may be used. In some instances, temperatures no greater than 125° C. may be used. Moreover, the same bonding process can be carried out using adhesion layers of a-Si since the upper layers of a-Si are oxidized. The improved quality of the bonded interface in the hybrid wafer bonding may be due to the increased surface reactivity and enhanced hydrophilicity. The improved quality of the bonded interface may also provide a favorable chemical environment for strong covalent bond formation. The hybrid wafer bonding process allows for the bonding of vapor cells at low temperatures, making it suitable for various advanced applications and offering improved precision and sensitivity in quantum devices.

In some aspects of what is described, a vapor cell may also be described by the following examples:

Example 1. A vapor cell, comprising:

a dielectric body comprising a surface that defines an opening to a cavity in the dielectric body, the cavity configured to contain a vapor;

an optical window covering the opening to the cavity and having a surface bonded to the surface of the dielectric body to form a seal around the opening; and the seal, comprising a metal oxynitride layer disposed along an interface between the surface of the dielectric body and the surface of the optical window.

Example 2. The vapor cell of example 1, comprising:

the vapor, disposed in the cavity and comprising a vapor of alkali metal atoms.

Example 3. The vapor cell of example 1 or example 2, comprising:

a source of the vapor disposed in the cavity and comprising a liquid or solid source of alkali metal atoms that produces a vapor of alkali metal atoms when heated or irradiated.

Example 4. The vapor cell of example 1 or example 2, wherein the cavity is a first cavity;

wherein the dielectric body comprises:

a second cavity between the first cavity and an outer surface of dielectric body, and a channel that fluidly couples the second cavity and the first cavity; and wherein the vapor cell comprises:

a source of the vapor disposed in the second cavity, the source of the vapor comprising a liquid or solid source of alkali metal atoms that produces a vapor of alkali metal atoms when heated or irradiated.

Example 5. The vapor cell of example 1 or any one of examples 2-4, wherein the metal oxynitride layer is a silicon oxynitride layer.

Example 6. The vapor cell of example 1 or any one of examples 2-4, wherein the metal oxynitride layer is an aluminum oxynitride layer.

Example 7. The vapor cell of example 1 or any one of examples 2-6, wherein the dielectric body is a silicon dielectric body.

Example 8. The vapor cell of example 7, wherein the silicon dielectric body comprises a silicon oxide layer that defines the surface of the silicon dielectric body.

Example 9. The vapor cell of example 1 or any one of examples 2-6, wherein the dielectric body is a glass dielectric body that comprises silicon oxide.

Example 10. The vapor cell of example 9, wherein the glass dielectric body comprises an amorphous silicon layer that defines the surface of the glass dielectric body.

Example 11. The vapor cell of example 1 or any one of examples 2-10, wherein the optical window is a glass optical window that comprises silicon oxide.

Example 12. The vapor cell of example 1 or any one of examples 2-11, comprising an antirelaxation coating disposed on one or more surfaces of the cavity.

In some aspects of what is described, a method of manufacturing a vapor cell may be described by the following examples:

Example 13. A method of manufacturing a vapor cell, comprising:

obtaining a dielectric body comprising a surface that defines an opening to a cavity in the dielectric body, the cavity configured to contain a vapor;

obtaining an optical window that comprises a surface; and contacting the surface of the dielectric body and the surface of the optical window to form a seal around the opening to the cavity, the seal comprising a metal oxynitride layer that is disposed along an interface between the surface of the dielectric body and surface of the optical window.

Example 14. The method of example 13, wherein contacting the surface of the dielectric body and the surface of the optical window comprises covering the opening of the cavity with the optical window to enclose the cavity.

Example 15. The method of example 13 or example 14, wherein the seal is formed at a temperature no greater than 150° C.

Example 16. The method of example 13 or example 14, wherein the seal is formed at a temperature between 100° C. and 150° C.

Example 17. The method of example 13 or any one of examples 14-16, comprising:

before contacting the surface of the dielectric body and the surface of the optical window:

exposing the surfaces of the dielectric body and the optical window to a sequence of plasmas to produce an altered surface of the dielectric body and an altered surface of the optical window, the sequence of plasmas comprising an oxygen plasma and a nitrogen plasma;

wherein contacting the surface of the dielectric body and the surface of the optical window comprises contacting the altered surface of the dielectric body and the altered surface of the optical window.

Example 18. The method of example 17, wherein the oxygen plasma precedes the nitrogen plasma in the sequence of plasmas.

Example 19. The method of example 17 or example 18, wherein exposing the surfaces comprises forming metal oxygen and metal nitrogen bonds on the surfaces of the dielectric body and the optical window to produce their respective altered surfaces, the respective altered surfaces comprising the metal oxygen and metal nitrogen bonds.

Example 20. The method of example 19, wherein contacting the altered surfaces comprises reacting the metal oxygen and metal nitrogen bonds to form the metal oxynitride layer of the seal.

Example 21. The method of example 17 or any one of examples 18-20, comprising:

heating the altered surfaces of the dielectric body and the optical window to a temperature no greater than 150° C. after contacting the altered surfaces.

Example 22. The method of example 17 or any one of examples 18-20, comprising:

heating the altered surfaces of the dielectric body and the optical window to a temperature between 100° C. and 150° C. after contacting the altered surfaces.

Example 23. The method of example 17 or any one of examples 18-22, comprising:

applying a voltage between the dielectric body and the optical window after contacting the altered surfaces.

Example 24. The method of example 23, wherein the voltage has a magnitude between 700 Volts and 1500 Volts.

Example 25. The method of example 23 or example 24, wherein the dielectric body and the optical window comprise respective outer perimeter surfaces; and wherein the method comprises applying conductive paste to the respective outer perimeter surfaces after contacting the altered surfaces, the conductive paste electrically coupling the dielectric body and the optical window.

Example 26. The method of example 13 or any one of examples 14-25, comprising:

disposing a vapor into the cavity of the dielectric body before contacting the surface of the dielectric body and the surface of the optical window, the vapor comprising a vapor of alkali metal atoms.

Example 27. The method of example 13 or any one of examples 14-25, comprising:

disposing a source of the vapor into the cavity of the dielectric body before contacting the surface of the dielectric body and the surface of the optical window, the source of the vapor comprising a liquid or solid source of alkali metal atoms; and producing a vapor of alkali metal atoms in the cavity by heating or irradiating the source of the vapor after the seal is formed.

Example 28. The method of example 13 or any one of examples 14-25, wherein the cavity is a first cavity;

wherein the dielectric body comprises:

a second cavity between the first cavity and an outer surface of dielectric body, and a channel that fluidly couples the second cavity and the first cavity; and wherein the method comprises:

disposing a source of the vapor into the second cavity of the dielectric body before contacting the surface of the dielectric body and the surface of the optical window, the source of the vapor comprising a liquid or solid source of alkali metal atoms, and producing a vapor of alkali metal atoms in the first cavity by heating or irradiating the source of the vapor after the seal is formed.

Example 29. The method of example 13 or any one of examples 14-28, wherein the metal oxynitride layer is a silicon oxynitride layer.

Example 30. The method of example 13 or any one of examples 14-29, wherein the dielectric body is a silicon dielectric body; and wherein the method comprises forming a silicon oxide layer on the silicon dielectric body, the silicon oxide layer defining the surface of the silicon dielectric body.

Example 31. The method of example 13 or any one of examples 14-29, wherein the dielectric body is a glass dielectric body that comprises silicon oxide; and wherein the method comprises forming an amorphous silicon layer on the glass dielectric body, the amorphous silicon layer defining the surface of the glass dielectric body.

Example 32. The method of example 13 or any one of examples 14-31, wherein the optical window is a glass optical window that comprises silicon oxide.

Example 33. The method of example 13 or any one of examples 14-32, comprising:

disposing an anti-relaxation coating on one or more surfaces of the cavity before contacting the surfaces.

Example 34. The method of example 13 or any one of examples 14-33, wherein the surface of the dielectric body and the surface of the optical window have a surface roughness, $R_a$, no greater than 1 nm.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A vapor cell, comprising:

a dielectric body comprising a surface that defines an opening to a cavity in the dielectric body, the cavity configured to contain a vapor;

an optical window covering the opening to the cavity and having a surface bonded to the surface of the dielectric body to form a seal around the opening; and the seal, comprising a metal oxynitride layer disposed along an interface between the surface of the dielectric body and the surface of the optical window;

wherein the metal oxynitride layer is formed by reacting metal oxygen and metal nitrogen bonds along the interface during contact of the surface of the dielectric body and the surface of the optical window; and wherein the metal oxygen and metal nitrogen bonds are formed by exposing, before contact, the surface of the dielectric body and the surface of the optical window to a sequence of plasmas that comprises an oxygen plasma and a nitrogen plasma.

2. The vapor cell of claim 1, comprising:

the vapor, disposed in the cavity and comprising a vapor of alkali metal atoms.

3. The vapor cell of claim 1, comprising:

a source of the vapor disposed in the cavity and comprising a liquid or solid source of alkali metal atoms that produces a vapor of alkali metal atoms when heated or irradiated.

4. The vapor cell of claim 1, wherein the cavity is a first cavity;

wherein the dielectric body comprises:

a second cavity between the first cavity and an outer surface of dielectric body, and a channel that fluidly couples the second cavity and the first cavity; and wherein the vapor cell comprises:

a source of the vapor disposed in the second cavity, the source of the vapor comprising a liquid or solid source of alkali metal atoms that produces a vapor of alkali metal atoms when heated or irradiated.

5. The vapor cell of claim 1, wherein the metal oxynitride layer is a silicon oxynitride layer.

6. The vapor cell of claim 1, wherein the metal oxynitride layer is an aluminum oxynitride layer.

7. The vapor cell of claim 1, wherein the dielectric body is a silicon dielectric body.

8. The vapor cell of claim 7, wherein the silicon dielectric body comprises a silicon oxide layer that defines the surface of the silicon dielectric body.

9. The vapor cell of claim 1, wherein the dielectric body is a glass dielectric body that comprises silicon oxide.

10. The vapor cell of claim 9, wherein the glass dielectric body comprises an amorphous silicon layer that defines the surface of the glass dielectric body.

11. The vapor cell of claim 1, wherein the optical window is a glass optical window that comprises silicon oxide.

12. The vapor cell of claim 1, comprising an antirelaxation coating disposed on one or more surfaces of the cavity.

13. A method of manufacturing a vapor cell, comprising:
obtaining a dielectric body comprising a surface that defines an opening to a cavity in the dielectric body, the cavity configured to contain a vapor;
obtaining an optical window that comprises a surface;
exposing the surfaces of the dielectric body and the optical window to a sequence of plasmas to produce an altered surface of the dielectric body and an altered surface of the optical window, the sequence of plasmas comprising an oxygen plasma and a nitrogen plasma; and
contacting the altered surface of the dielectric body and the altered surface of the optical window to form a seal around the opening to the cavity, the seal comprising a metal oxynitride layer that is disposed along an interface between the surface of the dielectric body and surface of the optical window.

14. The method of claim 13, wherein contacting the surface of the dielectric body and the surface of the optical window comprises covering the opening of the cavity with the optical window to enclose the cavity.

15. The method of claim 13, wherein the seal is formed at a temperature no greater than 150° C.

16. The method of claim 13, wherein the oxygen plasma precedes the nitrogen plasma in the sequence of plasmas.

17. The method of claim 13, wherein exposing the surfaces comprises forming metal oxygen and metal nitrogen bonds on the surfaces of the dielectric body and the optical window to produce their respective altered surfaces, the respective altered surfaces comprising the metal oxygen and metal nitrogen bonds.

18. The method of claim 17, wherein contacting the altered surfaces comprises reacting the metal oxygen and metal nitrogen bonds to form the metal oxynitride layer of the seal.

19. The method of claim 13, comprising:
heating the altered surfaces of the dielectric body and the optical window to a temperature no greater than 150° C. after contacting the altered surfaces.

20. The method of claim 13, comprising:
applying a voltage between the dielectric body and the optical window after contacting the altered surfaces.

21. The method of claim 20, wherein the voltage has a magnitude between 700 Volts and 1500 Volts.

22. The method of claim 20,
wherein the dielectric body and the optical window comprise respective outer perimeter surfaces; and
wherein the method comprises applying conductive paste to the respective outer perimeter surfaces after contacting the altered surfaces, the conductive paste electrically coupling the dielectric body and the optical window.

23. The method of claim 13, comprising:
disposing a vapor into the cavity of the dielectric body before contacting the surface of the dielectric body and the surface of the optical window, the vapor comprising a vapor of alkali metal atoms.

24. The method of claim 13, comprising:
disposing a source of the vapor into the cavity of the dielectric body before contacting the surface of the dielectric body and the surface of the optical window, the source of the vapor comprising a liquid or solid source of alkali metal atoms; and
producing a vapor of alkali metal atoms in the cavity by heating or irradiating the source of the vapor after the seal is formed.

25. The method of claim 13,
wherein the cavity is a first cavity;
wherein the dielectric body comprises:
a second cavity between the first cavity and an outer surface of dielectric body, and
a channel that fluidly couples the second cavity and the first cavity; and
wherein the method comprises:
disposing a source of the vapor into the second cavity of the dielectric body before contacting the surface of the dielectric body and the surface of the optical window, the source of the vapor comprising a liquid or solid source of alkali metal atoms, and
producing a vapor of alkali metal atoms in the first cavity by heating or irradiating the source of the vapor after the seal is formed.

26. The method of claim 13, wherein the metal oxynitride layer is a silicon oxynitride layer.

27. The method of claim 13,
wherein the dielectric body is a silicon dielectric body; and
wherein the method comprises forming a silicon oxide layer on the silicon dielectric body, the silicon oxide layer defining the surface of the silicon dielectric body.

28. The method of claim 13,
wherein the dielectric body is a glass dielectric body that comprises silicon oxide; and
wherein the method comprises forming an amorphous silicon layer on the glass dielectric body, the amorphous silicon layer defining the surface of the glass dielectric body.

29. The method of claim 13, comprising:
disposing an anti-relaxation coating on one or more surfaces of the cavity before contacting the surfaces.

* * * * *